(12) United States Patent
Asano

(10) Patent No.: US 7,173,291 B2
(45) Date of Patent: Feb. 6, 2007

(54) VERTICAL PROTECTING ELEMENT FORMED IN SEMICONDUCTOR SUBSTRATE AND SEMICONDUCTOR DEVICE USING THE SAME

(75) Inventor: Tetsuro Asano, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/257,503

(22) Filed: Oct. 25, 2005

(65) Prior Publication Data

US 2006/0097320 A1     May 11, 2006

(30) Foreign Application Priority Data

Oct. 25, 2004    (JP) .............................. 2004-309426

(51) Int. Cl.
     *H01L 29/72*      (2006.01)
(52) U.S. Cl. ................ 257/173; 257/107; 257/E29.338
(58) Field of Classification Search ..................... None
See application file for complete search history.

(56) References Cited

U.S. PATENT DOCUMENTS 6,121,661 A * 9/2000 Assaderaghi et al.

FOREIGN PATENT DOCUMENTS

| JP | 6-029466 | 2/1994 |
|---|---|---|
| JP | 7-169918 | 7/1995 |
| WO | WO-2004-027869 A1 | 4/2004 |

* cited by examiner

*Primary Examiner*—Nathan J. Flynn
*Assistant Examiner*—Kevin Quinto
(74) *Attorney, Agent, or Firm*—Morrison & Foerster LLP

(57) ABSTRACT

Between a terminal of an element to be protected and a GND terminal, a protecting element is connected, which includes a first n+ region, an insulating region and a second n+ region. The first n+ region is provided to have a columnar shape in a depth direction of a substrate, and the second n+ region is formed to have a plate shape and disposed so as to face a bottom of the first n+ region. Thus, it is possible to allow a very large static current to flow into a ground potential through a first current path and a second current path. Thus, electrostatic energy reaching an operation region of a HEMT can be significantly reduced while hardly increasing a parasitic capacity.

30 Claims, 21 Drawing Sheets

FIG.6

|  | current value (A) | capacity value (fF) | current value / capacity value (A/fF) |
|---|---|---|---|
| protecting elememt (w1=3.4 μm) | 114.3 | 1.27 | 9.00E+01 |

| protecting element of this embodiment (w1=3.4 μm) | current value (A) | capacity value (fF) | current value / capacity value (A/fF) |
|---|---|---|---|
| | 114.3 | 1.27 | 9.00E+01 |

| | | current value per 1 μm of width (A) | capacity value per 1 μm of width (fF) | current value / capacity value (A/fF) | |
|---|---|---|---|---|---|
| related art | structure "a" | 0.45 | 2.73 | 1.65E-01 | |
| | | current value per 1 μm of width of n+ region (A) | capacity value per 1 μm of width of n+ region (fF) | current value / capacity value (A/fF) | |
| | structure "b" | 1.24 | 0.10 | 1.24E+01 | |
| | | current value (A) | capacity value (fF) | current value / capacity value (A/fF) | electrostatic breakdown voltage (V) |
| | structure "c" | 99.2 | 8.00 | 1.24E+01 | 1800 |

Prior Art

Prior Art

Prior Art

VERTICAL PROTECTING ELEMENT FORMED IN SEMICONDUCTOR SUBSTRATE AND SEMICONDUCTOR DEVICE USING THE SAME

BACKGROUND OF THE INVENTION

1. Field of the Invention

The present invention relates to a protecting element and a semiconductor device using the same. More particularly, the present invention relates to a protecting element which allows a significant improvement in an electrostatic breakdown voltage without deteriorating high-frequency characteristics or a computation processing speed of each element to be protected, and a semiconductor device using the protecting element.

2. Description of the Related Art

In a conventional semiconductor device, there has been adopted a method of connecting electrostatic breakdown protecting diodes in parallel with a device including a pn junction, a Schottky junction or a capacitor, which are weak in electrostatic breakdown, in order to protect the device from static electricity in general.

FIG. 21 shows an electrostatic breakdown protecting circuit of a conventional semiconductor device. The electrostatic breakdown protection circuit adopts the following configuration to connect itself to an internal circuit. Specifically, pn junction diodes D1 and D2 are formed near a bonding pad 301 for external input and output. In addition, the anode of the diode D1 is connected to the bonding pad 301, and the cathode thereof is connected to a power-supply terminal Vcc. Moreover, the cathode of the diode D2 is connected to the bonding pad 301, and the anode thereof is connected to a ground terminal. Furthermore, an electrode wiring 302 extended from the bonding pad 301 is connected to one end of a resistor region 303 formed of a p-type diffusion region, and the other end of the resistor region 303 is connected to an electrode wiring 304. This technology is described for instance in Japanese Patent Application Publication No. Hei 6 (1994)-29466.

Moreover, as shown in FIG. 22, there has been also known a technology of connecting a protecting element 360 having an n+/i/n+ structure between two terminals of an element to be protected, in order to significantly improve an electrostatic breakdown voltage in a compound semiconductor device. FIG. 22 shows a switching circuit device formed of FETs, each having a source 315, a gate 317 and a drain 320. In the switching circuit device, the protecting elements 360 are connected between an input terminal and a control terminal and between an output terminal and the control terminal. This technology is described for instance in International Publication WO 2004/027869 (FIG. 12).

FIG. 23 shows an integrated circuit device (hereinafter referred to as an LSI), in which a protecting element region 407 is formed around a logic circuit 408. FIG. 23 shows a protection circuit against an overvoltage caused by static electricity and the like for a MOS type IC. The protection circuit is a so-called CMOS buffer circuit type protection circuit in which protecting elements of a grounded-gate p-channel MOSFET 401 and a grounded-gate n-channel MOSFET 402 is disposed around the logic circuit 408. A signal line 403 connected to an input/output terminal pad 400 is connected to a reference voltage GND through the n-channel MOSFET 402 and to a power-supply voltage Vcc through the p-channel MOSFET 401. This technology is described for instance in Japanese Patent Application Publication No. Hei 7 (1995)-169918.

Generally, in order to protect a device from static electricity, there has been adopted a method of connecting protecting diodes in parallel with an element (device) to be protected, as in the case of the pn junction diodes in FIG. 21.

However, in a microwave device, an increase in a parasitic capacity due to connection of protecting diodes causes deterioration of high-frequency characteristics. Thus, the method described above cannot be adopted. Particularly, in a compound semiconductor device, such as a MESFET and a HEMT (high electron mobility transistor), which is used for microwaves of a GHz range or more, such as for satellite broadcasting, portable telephones and wireless broadband, it is required to secure good microwave characteristics. Thus, a gate length is also set in a submicron order, and a gate Schottky junction capacity is designed to be very small. Thus, the compound semiconductor device is very weak in electrostatic breakdown, and it is required to pay close attention to handling thereof including a MMIC in which a GaAs MESFET and a HEMT are integrated. Furthermore, in a low-frequency general consumer semiconductor for audio, video, power management and the like, a protecting diode widely used for increasing an electrostatic breakdown voltage has a pn junction. Specifically, a parasitic capacity is significantly increased to several hundred fF or more at the minimum by using the protecting diode. Thus, there is a problem that microwave characteristics of the compound semiconductor device described above are significantly deteriorated.

Meanwhile, in the switch MMIC shown in FIG. 22, n+ regions 350 are provided around a common input terminal pad IN Pad and around an OUT-1 Pad and an OUT-2 Pad for improving isolation. The n+ regions 350 and resistors R1 or R2, which are formed by ion implantation of n+ impurities, are disposed so as to get close to each other up to 4 μm. These n+ regions disposed close to each other and an insulating region (a GaAs substrate) 355 disposed between the regions form a protecting element 360.

Since the protecting element 360 has no pn junction, a parasitic capacity is as small as several fF compared with the protecting diode described above. However, it is found out that a part of an input signal inputted from the common input terminal pad IN Pad leaks into a control terminal pad Ctl-1 Pad that is a high-frequency GND potential through the resistor R1. This is because the resistor R1 and the common input terminal pad IN Pad are disposed close to each other over a long distance of 80 μm in order to enhance a protecting effect, at a point close to the control terminal pad Ctl-1 Pad.

Such a leakage of the input signal due to the parasitic capacity of about several fF does not become a problem in a switch MMIC including a MESFET as a switching element, for example. However, the leakage of the input signal becomes a problem particularly in the case where the protecting elements are connected in a switch MMIC including a HEMT having a small off capacity as a switching element. The leakage of the input signal exceeds a negligible level with respect to the small off capacity of the HEMT even by just several fF. Thus, the leakage affects the high-frequency characteristics, and an insertion loss is deteriorated compared with that in the case where the protecting elements 360 are not connected.

Moreover, in an LSI 410 such as a CMOS logic circuit element as shown in FIG. 23, performance of a MOSFET that is a basic element included in the logic circuit 408 is increasingly enhanced along with device refinement. Specifically, a gate length is getting shorter and a gate oxide film is getting thinner. However, at the same time, the element is getting weak in electrostatic breakdown. Thus, in order to protect the element, the protecting element region 407 having a plurality of protecting elements disposed therein is disposed around the logic circuit 408. However, the larger the size of the protecting element is, the more the protection effect is enhanced. Accordingly, under the present situation, an area of the protecting element region 407 has become too large compared with an area of the logic circuit 408. Thus, there is a problem that the cost for the LSI 410 is increased. Moreover, even if the size of the protecting element region 407 is increased to a certain degree or more, operations as the protecting elements become uneven. Thus, there is also a problem that the protection effect is limited. Furthermore, if the protecting element region 407 is large, large protecting elements are connected in parallel. Thus, there is also an adverse effect that a computation processing speed of the LSI 410 is reduced by the parasitic capacity of the protecting element.

SUMMARY OF THE INVENTION

The present invention provides a protecting element protecting an element of a semiconductor device that includes a semiconductor substrate comprising a top primary plane and a bottom primary plane, a first high-concentration impurity region formed in the semiconductor substrate and extending form the top primary plane toward the bottom primary plane, a second high-concentration impurity region formed in the semiconductor substrate along the bottom primary plane, a bottom of the first high-concentration impurity region being adjacent the second high-concentration impurity region but not being in contact with the second high-concentration impurity region, and an insulating region in contact with the first and second high-concentration impurity regions, wherein the first high-concentration impurity region is connected with a terminal of the protected element and a reference potential is applied to the second high-concentration impurity region, and the protecting element is configured to release electrostatic energy applied to the terminal of the protected element by inducing a conductive path in the insulating region between the first and second high-concentration impurity regions upon the application of the electrostatic energy.

The present invention provides a semiconductor device that includes a semiconductor substrate comprising a top primary plane and a bottom primary plane, a field effect transistor formed on the top primary plane and comprising a source electrode, a gate electrode and a drain electrode, an input terminal connected with the source electrode or the drain electrode, an output terminal connected with the source electrode or the drain electrode that is not connected to the input terminal, a control terminal connected with the gate electrode, a protecting element, protecting the transistor, comprising a first high-concentration impurity region formed in the semiconductor substrate and having a column-like structure extending from the top primary plane toward the bottom primary plane, a second high-concentration impurity region formed in the semiconductor substrate along the bottom primary plane, a bottom of the first high-concentration impurity region being adjacent the second high-concentration impurity region but not being in contact with the second high-concentration impurity region, and an insulating region in contact with the first and second high-concentration impurity regions, wherein the first high-concentration impurity region is connected with one of the terminals of the transistor and a reference potential is applied to the second high-concentration impurity region, and the protecting element is configured to release electrostatic energy applied to the terminal connected with the first high-concentration impurity region by inducing a first conductive path between the bottom of the first high-concentration impurity region and the second high-concentration impurity region and a second conductive path between a sidewall of the column-like structure and the second high-concentration impurity region.

The present invention provides a semiconductor device that includes a semiconductor substrate comprising a top primary plane and a bottom primary plane, an integrated circuit element comprising an input-and-output terminal, a power supply terminal and a ground terminal, a protecting element, protecting the integrated circuit element, comprising a first high-concentration impurity region formed in the semiconductor substrate and having a column-like structure extending form the top primary plane toward the bottom primary plane, a second high-concentration impurity region formed in the semiconductor substrate along the bottom primary plane, a bottom of the first high-concentration impurity region being adjacent the second high-concentration impurity region but not being in contact with the second high-concentration impurity region, and an insulating region in contact with the first and second high-concentration impurity regions, wherein the first high-concentration impurity region is connected with the input-and-output terminal and the second high-concentration impurity region is connected with the ground terminal, and the protecting element is configured to release electrostatic energy applied to the input-and-output terminal by inducing a first conductive path between the bottom of the first high-concentration impurity region and the second high-concentration impurity region and a second conductive path between a sidewall of the column-like structure and the second high-concentration impurity region.

BRIEF DESCRIPTION OF THE DRAWINGS

FIG. 6 is a table showing a simulation result of the first embodiment of the protecting element of the present invention.

FIG. 11 is a table comparing simulation results between the conventional structure and the first embodiment of the present invention.

DESCRIPTION OF THE EMBODIMENTS

With reference to FIGS. 1 to 20, embodiments of the present invention will be described in detail below. First, with reference to FIGS. 1 to 11, a first embodiment of the present invention will be described.

Figure 1A:
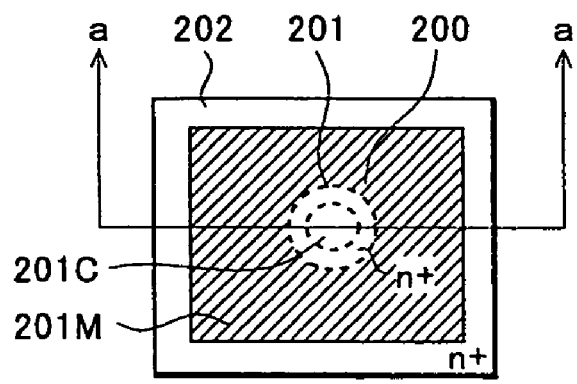
FIG. 1A is a plan view and FIGS. 1B to 1D are cross-sectional views showing a protecting element of a first embodiment of the present invention.
Figure 1B:
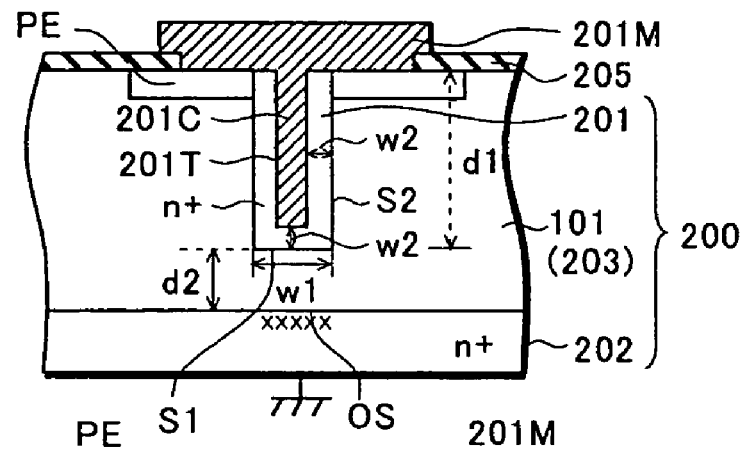
Figure 1C:
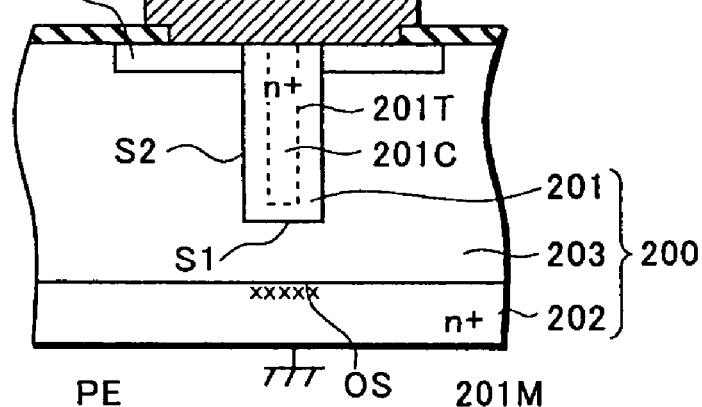
Figure 1D:
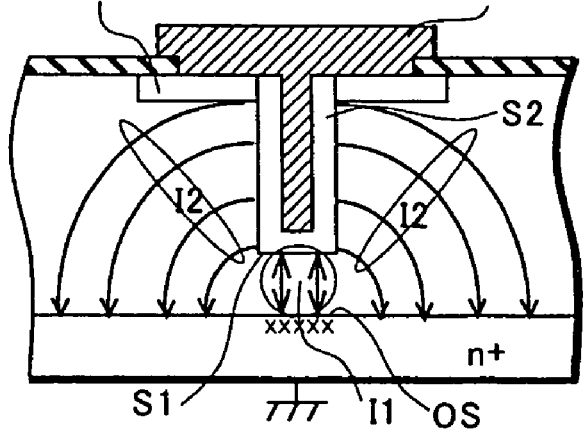

FIGS. 1A to 1D are schematic views showing a protecting element 200 of the first embodiment. FIG. 1A is a plan view and FIGS. 1B to 1D are cross-sectional views along the line a—a in FIG. 1A.

The protecting element 200 includes: a first high-concentration impurity region 201 provided in a substrate 101; a second high-concentration impurity region 202 provided in a bottom of the substrate 101 so as to face a part of the first high-concentration impurity region 201; and an insulating region 203 disposed around those impurity regions.

The substrate 101 may be a semiconductor substrate such as a silicon semiconductor substrate, a compound semiconductor substrate, and a substrate on which epitaxial layers are grown for HEMT. The first and second high-concentration impurity regions 201 and 202 are impurity regions having the same conductivity type, which will be described below as first and second n+ regions 201 and 202, respectively, by taking the case of n-type impurities as an example.

The first n+ region 201 is an impurity region formed to have a columnar shape in a depth (vertical) direction of the substrate 101. The first n+ region 201 has a first side S1 approximately parallel to a horizontal direction of the substrate 101, and a second side S2 approximately parallel to the vertical direction of the substrate 101 (refer to FIGS. 1B to D).

To be more specific, the first n+ region 201 is an ion implantation region of impurities or a diffusion region thereof, which is provided along at least a periphery of a trench 201T provided in the substrate 101. Specifically, the first n+ region 201 has the first side S1 along a bottom of the trench 201T and the second side S2 along a sidewall of the trench 201T.

A conductive material 201C is buried in the trench 201T. And the first n+ region 201 is connected to one terminal of an element to be protected through a metal layer 201M provided on a surface of the substrate 101. The metal layer 201M is a metal layer extended from a part of an electrode pad connected to the terminal of the element to be protected, a wiring connected to the electrode pad or a part of the electrode pad.

Moreover, the conductive material 201C is the same metal layer as the metal layer 201M, another metal layer or polysilicon for achieving a low resistance by introducing impurities. As shown in FIG. 1B, in the case of burying the metal layer, the first n+ region 201 can be formed by ion-implanting or diffusing impurities into an inner wall of the trench 201T.

Moreover, in the case of burying polysilicon as shown in FIG. 1C, the first n+ region 201 can be formed, for example, by doping polysilicon with n-type impurities having a predetermined impurity concentration and diffusing the impurities from polysilicon. In this case, the inside of the trench 201T also becomes the first n+ region 201.

The second n+ region 202 is an ion implanting region of impurities or a diffusion region thereof, which is provided in the bottom of the substrate 101. The second n+ region 202 is provided to have a plate shape in a direction perpendicular to the first n+ region 201 having the columnar shape (in the horizontal direction of the substrate 101). In addition, a part of the second n+ region 202 faces the first side S1 of the first n+ region 201. An area of the second n+ region 202 is much larger than that of the first side S1, for example, 50 times larger or more. Moreover, the second n+ region 202 may be provided so as to position the first n+ region 201 approximately in the center thereof The first side S1 of the first n+ region 201 and a part of the second n+ region 202, which faces the first side S1 by the same area, (hereinafter referred to as an opposite face OS of the second n+ region 202) are provided at a distance d2 which allows electrostatic energy to pass, for example, about 4 μm. Both of the first side S1 and the opposite face OS have an impurity concentration of $1 \times 10^{17}$ cm$^{-3}$ or more. Moreover, the insulating region 203 is provided around the first and second n+ regions 201 and 202. Here, the insulating region 203 is an insulating region which is not completely electrically insulator and is a part of a semi-insulating substrate 101 or a region insulated by ion-implanting impurities into the substrate 101. Moreover, it is preferable that the insulating region 203 has an impurity concentration of about $5 \times 10^{14}$ cm$^{-3}$ or less and a resistivity of $1 \times 10^3$ Ωcm or more. Furthermore, the insulating region 203 may also be formed of undoped polysilicon.

The first side S1 has a width w1 of, for example, 3.4 μm, and the second side S2 has a length (depth) d1 of, for example, 50 μm. In the case where the conductive material 201C such as metal is buried in the trench 201T as shown in FIG. 1B, a width w2 of the first n+ region 201 is, for example, about 0.2 μm.

The metal layer 201M is an ohmic metal layer having an ohmic junction with the first n+ region 201 or a Schottky metal layer having a Schottky junction therewith. Alternatively, for reduction in a series resistance, another metal layer may be further superposed on the ohmic metal layer or the Schottky metal layer.

As described above, the protecting element 200 of this embodiment has a structure in which the first n+ region 201 having the columnar shape and the second n+ region 202 having the plate shape are provided so as to face each other and the insulating region 203 is disposed around those regions. In addition, the fist n+ region 201 is connected to the terminal of the element to be protected. Moreover, a ground potential is applied to the second n+ region 202. Furthermore, the distance d2 between the first side S1 of the first n+ region 201 and the opposite face OS of the second n+ region 202 is set to about 4 µm. Thus, electrostatic energy applied from the outside to the terminal of the element to be protected, to which the first n+ region 201 is connected, can be discharged to the ground potential through the insulating region 203.

The distance d2 of 4 µm is an appropriate distance for allowing the electrostatic energy to pass. If the distance d2 is 10 µm or more, discharge in the protecting element 200 is not ensured. Moreover, if the first side S1 and the opposite face are too close to each other, for example, if the distance d2 is 1 µm or less, an too low breakdown voltage and an increase in a parasitic capacity are caused, which is not preferable. The same goes for the impurity concentration of the first and second n+ regions 201 and 202 and for a resistance value of the insulating region 203.

FIG. 1D is a schematic view showing current paths during discharge. In this embodiment, in the insulating region 203 around the both terminals, the first and second n+ regions 201 and 202, during the discharge, a first current path I1 and a second current path I2 are formed as indicated by the arrows in FIG. 1D. Note that the current paths indicated by the arrows are symbolic, and the first and second current paths I1 and I2 will be described in detail later.

The first current path I1 is a path toward the opposite face OS of the second n+ region 202 from the first side S1 and is a path of an electron current and a hole current which are formed in the insulating region 203 in an extending direction of the first n+ region 201. Moreover, the second current path I2 is a path of an electron current and a hole current which are formed in the insulating region 203 outside the first current path I1. To be more specific, the second current path I2 is a current path formed in the insulating region 203 from the second side S2 toward the region of the second n+ region 202 other than the opposite face OS.

The first n+ region 201 can significantly reduce a parasitic capacity since the first side S1 facing the second n+ region 202(the opposite face OS) has a small area. Moreover, the conductive material 201C is buried in the trench 201T to allow the entire second side S2 to come into contact with the metal layer 201M. Furthermore, the first n+ region 201 is disposed approximately in the center of the second n+ region 202 having the plate shape with a large area. Thus, the second current path I2 can be formed to have a hemispherical shape by using the first n+ region 201 as a central axis, and a very large static current can flow through the second current path I2.

Therefore, the electrostatic energy applied to the first n+ region 201 that is the terminal of the protecting element 200 can be discharged by utilizing the first and second current paths I1 and I2 and released to the ground potential through the second n+ region 202.

The first n+ region 201 may be discontinuous regions as long as the region is connected to the same (one) metal layer 201M. In such a case, the discontinuous regions come into contact with the same metal layer 201M, respectively, to form the second current path I2. Thus, those regions are collectively set as the first n+ region 201 to be one of the terminals of the protecting element 200. Moreover, in such a case as where a high-concentration impurity region PE for improving isolation, for example, is disposed below the electrode pad or the wiring, the first n+ region 201 may be continuous with or discontinuous with the impurity region.

Figure 2A:
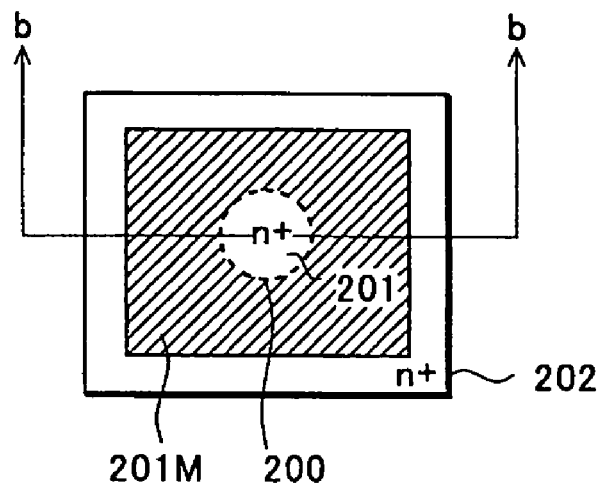
FIG. 2A is a plan view and FIGS. 2B and 2C are cross-sectional views showing a protecting element of the first embodiment of the present invention.
Figure 2B:
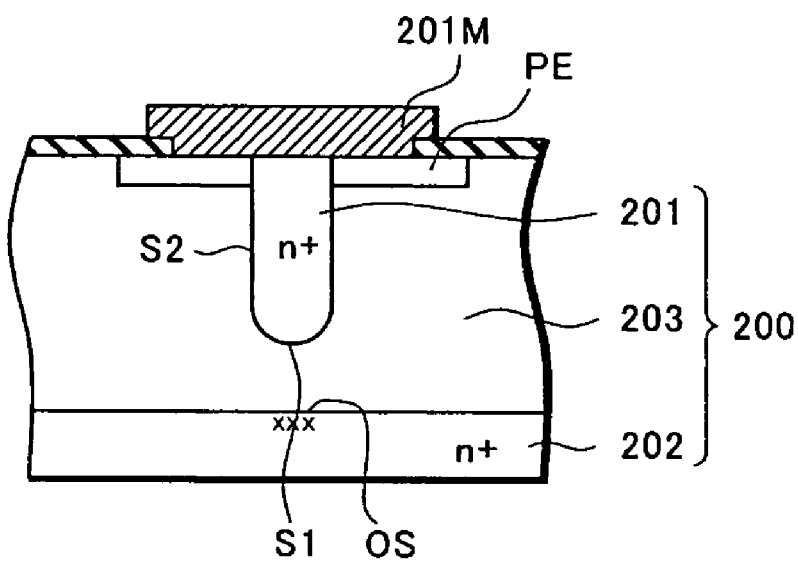
Figure 2C:
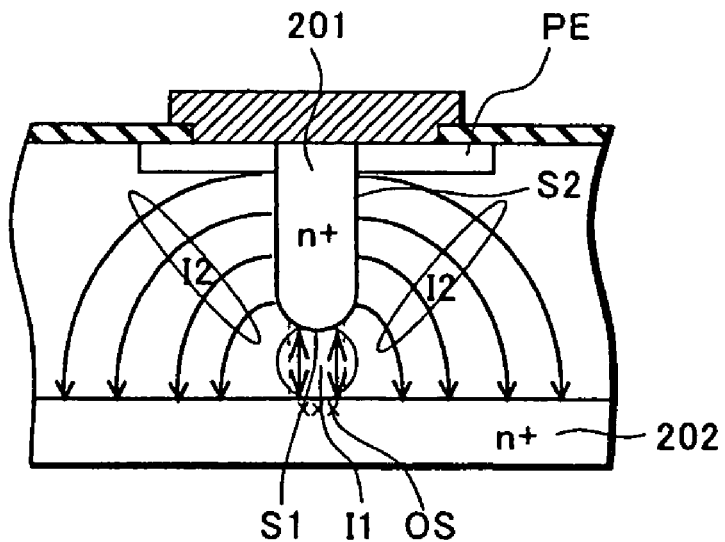

FIGS. 2A to 2C show another form of the first n+ region 201. FIG. 2A is a plan view and FIGS. 2B and 2C are cross-sectional views along the line b—b in FIG. 2A As shown in FIGS. 2A to 2C, the first n+ region 201 may be a region formed by diffusing impurities into a substrate 101 without providing a trench 201T.

For example, the first n+ region 201 having a columnar shape is provided by ion-implanting or diffusing n-type impurities to form a columnar shape in a depth direction of the substrate 101. The first n+ region 201 has a first side S1 approximately parallel to a horizontal direction of the substrate 101 and a second side S2 approximately parallel to a vertical direction of the substrate 101.

Thereafter, a metal layer 201M is made to come into contact with a surface of the substrate 101, where the first n+ region 201 is exposed, and the first n+ region 201 is connected to a terminal of an element to be protected through the metal layer 201M.

A first current path I1 is directed to an opposite face OS of a second n+ region 202 from the first side S1 and is formed in an insulating region 203 in an extending direction of the first n+ region 201. Moreover, a second current path I2 is directed to the region of the second n+ region 202 other than the opposite face OS to the first n+ region 201 from the second side S2, and is formed in the insulating region 203 outside the first current path I1.

Figure 3A:
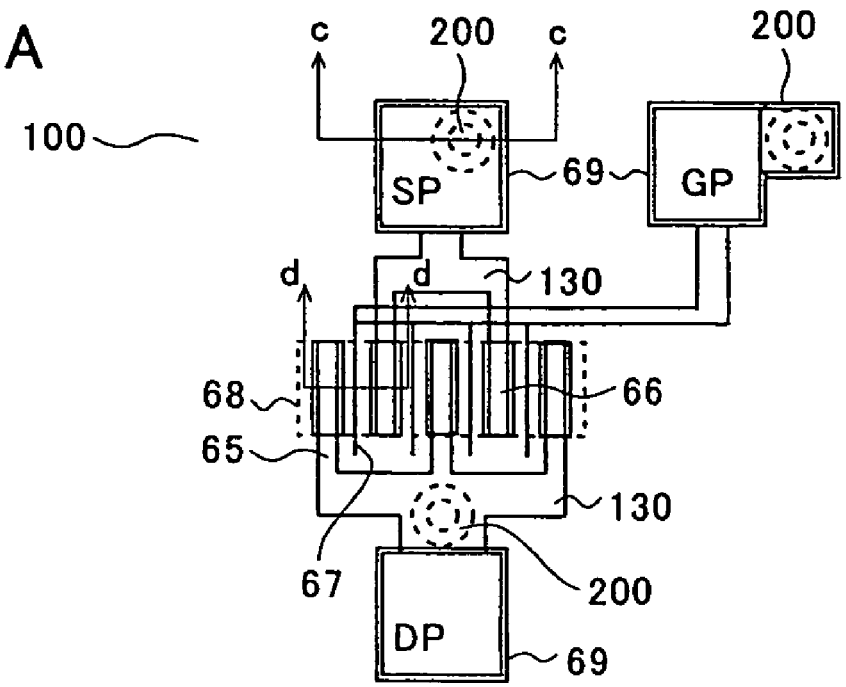
FIG. 3A is a plan view.
Figure 3B:
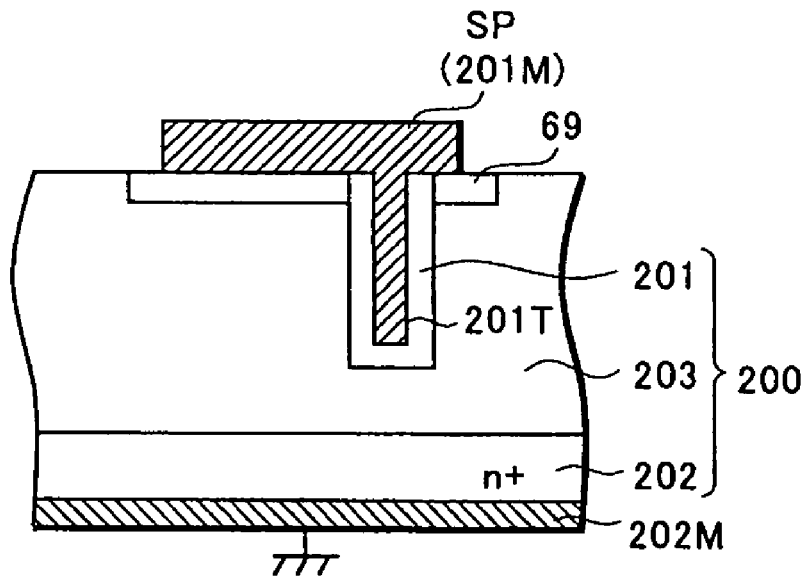
FIG. 3B is a cross-sectional view and FIG. 3C is a schematic circuit diagram showing the protecting element of the first embodiment of the present invention.
Figure 3C:
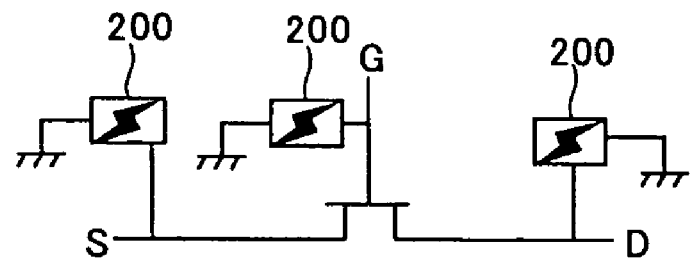

With reference to FIGS. 3A to 3C, a connection example of the protecting element 200 will be described. FIGS. 3A to 3C show the case where an element 100 to be protected is a GaAs MESFET. FIG. 3A is a plan view, FIG. 3B is a cross-sectional view along the line c—c in FIG. 3A, and FIG. 3C is an equivalent circuit diagram.

As shown in FIG. 3A, the element 100 to be protected is a MESFET, which includes: a gate electrode 67 which forms a Schottky junction with an operation layer 62 provided on a surface of GaAs that is the semi-insulating substrate 101 (203); a source region 64 and a drain region 63 which are formed of high-concentration impurity regions provided on both ends of the operation layer 62; and a source electrode 66 and a drain electrode 65 which are provided on the source region 64 and drain region 63, respectively. Those electrodes are disposed in a comb-teeth shape in an operation region 68.

The gate electrode 67, the source electrode 66 and the drain electrode 65 are connected to a gate pad GP, a source pad SP and a drain pad DP, respectively, through a wiring 130. The respective pads are connected to a gate terminal G, a source terminal S and a drain terminal D, respectively. Moreover, below the respective pads, n+ impurity regions 69 are formed for improving isolation.

As shown in FIG. 3B, below each of the pads, the trench 201T is provided, and the first n+ region 201 is disposed along a periphery of the trench 201T. Moreover, the conductive material 201C is buried in the trench 201T. The conductive material 201C comes into contact with the metal layer 201M provided on the substrate 101. In this case, the metal layer 201M is the source pad SP. Note that, description will be given below by assuming that the conductive material 201C is the same metal layer 201M as the pad. Moreover, as to the structure of the first n+ region 201, the description will be given by taking the one shown in FIG. 3B as an example.

The n+ impurity regions 69 are continuous with the first n+ region 201. The first n+ region 201 having a columnar shape is disposed so as to face the second n+ region 202 having a plate shape in a bottom of the substrate 101. The second n+ region 202 comes into contact with a metal layer 202M on a rear surface thereof, and a GND potential is applied thereto.

Thus, the protecting element 200 is connected to the source terminal S. Moreover, similarly, the protecting element 200 is also connected to the gate terminal G and the drain terminal D. Note that the gate terminal G and the drain terminal D show other forms of the metal layer 201M with which the first n+ region 201 comes into contact. For example, in the gate terminal G, the metal layer 201M is a metal layer protruded from the gate pad GP. Moreover, in the drain terminal D, the metal layer 201M is a part of the wiring 130 connected to the drain pad DP. In the case where a part of the wiring 130 is utilized as the metal layer 201M, the protecting element 200 is preferably connected as near the pad as possible.

In the case where static electricity is applied to the terminals of the element 100 to be protected, a very higher potential is applied than some kind of a reference potential such as a chassis potential of a set, for example. In this embodiment, a rear surface of the substrate 101 is set to the GND potential, and the GND potential is applied to one of the terminals (the second n+ region 202) of the protecting element 200. Thus, as shown in FIG. 3C, in the case where static electricity is applied to any one of the terminals of the element 100 to be protected, to which the other terminal (the first n+ region 201) of the protecting element 200 is connected, the static electricity can be discharged to the GND potential before entering an internal circuit. Therefore, the static electricity never enters the internal circuit, and weak junctions in the internal circuit of the element 100 to be protected can be protected from the static electricity.

After the element 100 to be protected is mounted on some kind of a set, static electricity tends to be applied to a pin (terminal) which is directly connected to outside (for example, an antenna) of the set. Meanwhile, although static electricity is hardly directly applied to a pin (terminal) connected to an internal circuit of the set, the pin may be indirectly influenced by the static electricity.

In this embodiment, the protecting elements 200 are connected to all electrode pads to which static electricity may be applied (for example, electrode pads other than the electrode pad to which the GND potential is applied). Thus, it is possible to protect the terminals to which the static electricity is directly or indirectly applied.

As shown in FIG. 3A, in the case where a plurality of the protecting elements 200 are connected to a plurality of terminals, a plurality of the first n+ regions 201 are connected to respective terminals of the element 100 to be protected. Meanwhile, the second n+ region 202 is provided in the entire bottom of the substrate and can be set as a common terminal for the respective first n+ regions 201. Moreover, the second n+ region 202 may be provided individually so as to correspond to each of the first n+ regions 201.

Figure 4:
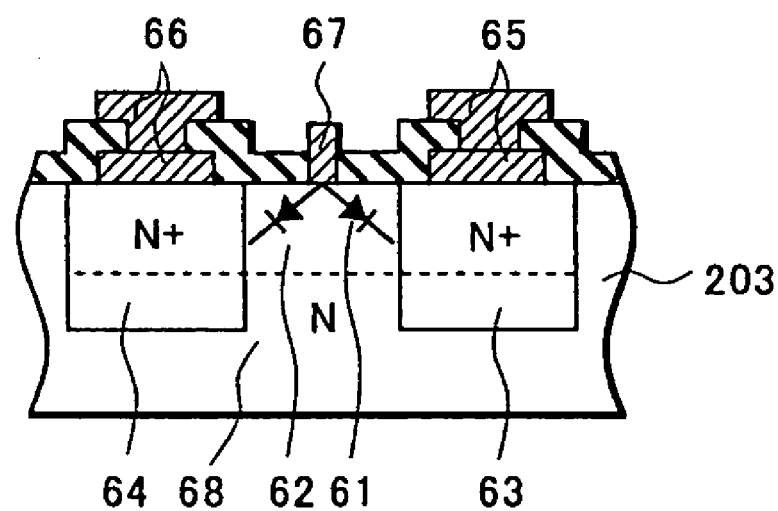
FIG. 4 is a cross-sectional view showing a GaAs MES-FET.

With reference to FIG. 4, the case where the protecting element is connected to a FET will be further described. FIG. 4 is a cross-sectional view along the line d—d in FIG. 3A.

As shown in FIG. 3A, the element 100 to be protected is a MESFET, which includes: the gate electrode 67 which forms a Schottky junction with the operation layer 62 provided on a surface of GaAs that is the semi-insulating substrate 101 (203); the source region 64 and the drain region 63 which are formed of high-concentration impurity regions provided on both ends of the operation layer 62; and the source electrode 66 and the drain electrode 65 which are provided on the source and drain regions, respectively. Those electrodes are disposed in a comb-teeth shape in the operation region 68.

In the MESFET, the case most weak in electrostatic breakdown is one in which a surge voltage is applied between the gate terminal G having a small gate Schottky junction capacity and the source terminal S or between the gate terminal G and the drain terminal D by setting the gate terminal G to be negative. In this case, the MESFET is set to be in a state where static electricity is applied at a reverse bias to a Schottky barrier diode 61 or 62 formed in an interface between the operation region 68 and the gate electrode 67 provided on the operation region 68.

Specifically, for protection from the electrostatic breakdown, electrostatic energy applied to the Schottky junction of the gate electrode 67, which is a weak junction, should be reduced. Therefore, in such a case, the protecting elements 200 should be connected to at least the gate terminal G and the source terminal S or the gate terminal G and the drain terminal D, respectively. By connecting the protecting element 200 between the two terminals of the MESFET 100, the junction weak in the electrostatic breakdown, that is the Schottky junction, can be protected.

The element 100 to be protected is not limited to the MESFET but may be a junction type FET having a pn junction, a silicon bipolar transistor (an npn transistor and the like), a capacity, a MOSFET, and the like. The same effects can be achieved by using any of those described above.

With reference to FIGS. 5 to 11, the protecting element 200 of this embodiment will be described in detail below based on simulation results.

The recent development of a semiconductor device simulation technology has enabled detailed simulation of not only electrical characteristics of a device but also electrostatic breakdown. As a result, it has become possible to appropriately design a protecting element as measures against the electrostatic breakdown.

To be more specific, charges are accumulated in a capacity at a predetermined voltage by a mixed-mode simulation. Thereafter, while monitoring a temperature of a crystal, the charges are discharged to both ends of an element to be measured. Assuming that breakdown of the device occurs when the temperature of the crystal reaches about 80% of the temperature at which the crystal melts, an electrostatic breakdown level of the element to be measured in a Machine Model is simulated.

Furthermore, recently, as another method for evaluating an electrostatic breakdown strength level, TLP (Transmission Line Pulse) method has been used to measure the electrostatic breakdown level. As a result, it has been found out that the measured value tends to agree with a value obtained by TLP simulation at the same time. Thus, the method has come under the spotlight.

This embodiment describes the following findings. Specifically, first, a mixed-mode simulation is performed for an electrostatic breakdown level in Machine Model. Thereafter, physical conditions of the protecting element 200 at the time of electrostatic breakdown are analyzed in detail by use of a simulation using the TLP method. As a result, by combining the simulations described above, the protecting element 200 having a small parasitic capacity and an excellent ability of protecting from electrostatic breakdown can be designed.

Figure 5A:
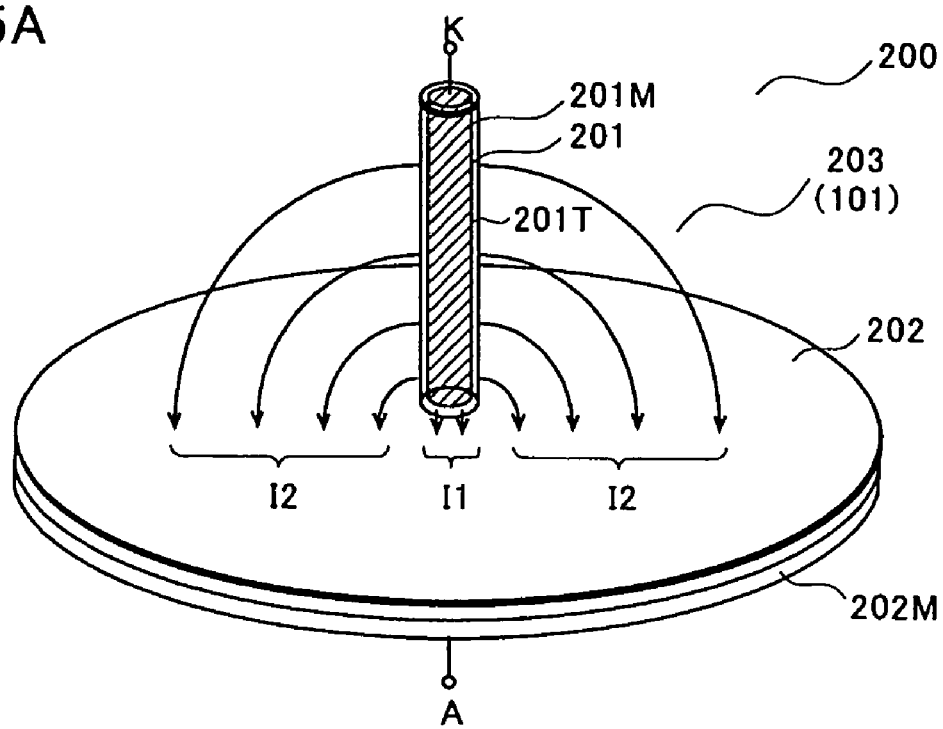
FIG. 5A is a perspective view and FIG. 5B is a cross-sectional view showing the protecting element of the first embodiment of the present invention.
Figure 5B:
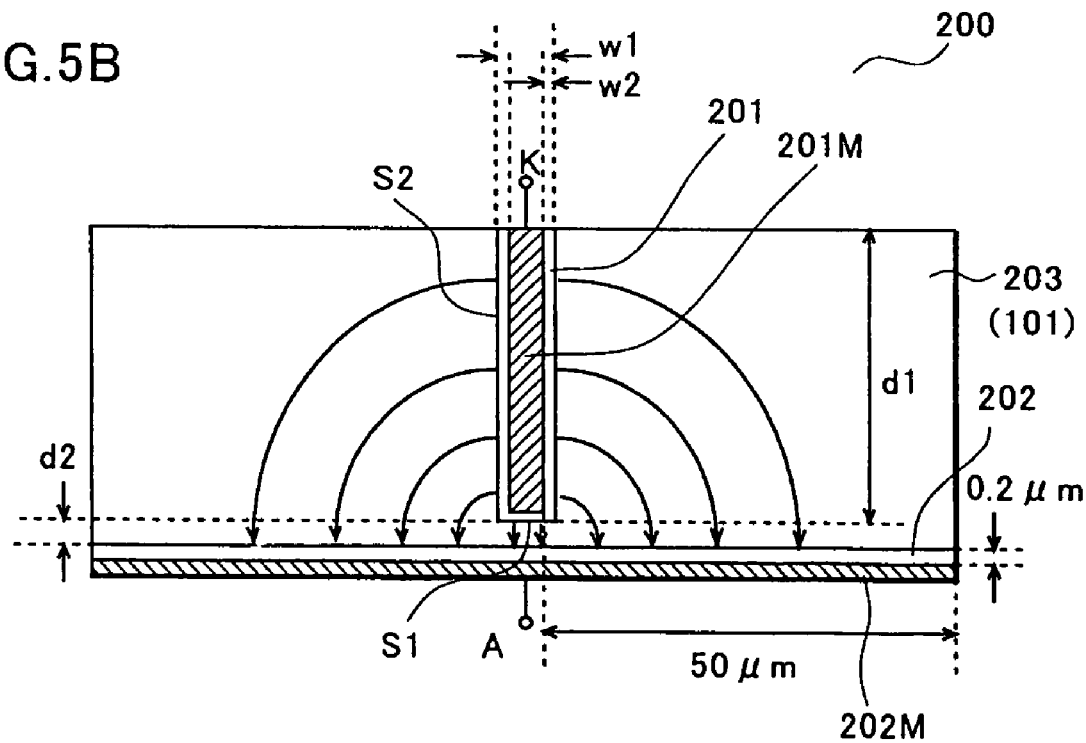

FIGS. 5A and 5B are views showing a structure used for simulations when the protecting element 200 of this embodiment is designed. FIG. 5A is a perspective view and FIG. 5B is a cross-sectional view As the structure of the protecting element 200, a columnar trench 201T having a depth of 50 µm is formed from a surface of a silicon substrate 101 having an impurity concentration of $5 \times 10^{14}$ cm$^{-3}$ and a thickness of 54 µm. Thereafter, n-type impurities having an impurity concentration of $3 \times 10^{18}$ cm$^{-3}$ are implanted into an inner wall of the trench. Thus, a first n+ region 201 is formed. Inside the trench 201T, a metal layer 201M is buried, which forms an ohmic junction with the first n+ region 201 and is to be a cathode electrode. A width (diameter) w1 of a first side S1 is 3.4 µm. Moreover, a width w2 of a second side S2 of the first n+ region 201 is 0.2 µm.

Moreover, a second n+ region 202 having an impurity concentration of $3 \times 10^{18}$ cm$^{-3}$ is formed on the entire bottom of the substrate 101, and a metal layer 202M to be an anode electrode is formed to have an ohmic junction with a rear surface of the second n+ region 202.

Within the bulk (inside a crystal) of the silicon substrate 101, a distance d2 between the first side S1 of the first n+ region 201 and an opposite face OS of the second n+ region 202 is set to 4 µm. Note that, if the impurity concentration is about $5 \times 10^{14}$ cm$^{-3}$, the silicon substrate 101 approximately functions as an insulating region 203. Specifically, in the structure, the first and a second n+ regions 201 and 202 are disposed so as to face each other within the insulating region 203.

In FIGS. 5A and 5B, a state of a flowing static current is indicated by the arrows when static electricity is applied between the cathode and the anode of the protecting element 200. As shown in FIGS. 5A and 5B, the static current flows through a first current path I1 and a second current path I2. The first current path I1 is formed in the insulating region 203 between the first side S1 of the first n+ region 201 and the opposite face OS of the second n+ region 202. Moreover, the second current path I2 is formed in the insulating region 203 from the second side S2 toward the second n+ region 202 except for the opposite face OS.

FIG. 6 shows a simulation result.

In the above-described simulation method for the Machine Model, 1000 V is applied at 200 pF, and a current value when breakdown occurs is calculated. To be more specific, a value of the current flowing between the cathode and the anode when a temperature reaches 1350K at any spot inside the crystal is calculated.

The calculation result of the current value is 114.3 A as shown in FIG. 6. At the same time, a capacity value of this structure calculated in a mixed mode is 1.27 fF. The capacity value indicates a capacity value (parasitic capacity value) which is parasitically generated between two terminals to which static electricity may be applied from the outside in an element to be protected when the protecting element 200 is connected to the element to be protected.

Here, all the protecting elements 200 are connected between electrode pads or wirings (or metal layers) connecting the pads and a rear surface of the substrate (a GND potential). Specifically, the parasitic capacity value generated between the two terminals of the element to be protected is a capacity value when two of the protecting elements 200 are series-connected, which are connected, respectively, between the respective electrode pads or the wirings (or metal layers) connecting the pads to which the two terminals are connected and the rear surface of the substrate.

When the element to be protected is operated, a bias voltage applied to the two terminals is 2.4 V assuming the case of a portable telephone. Accordingly, a capacity value is calculated when 2.4 V is applied between the cathode and the anode of one of the protecting elements 200 and 0 V is applied between the cathode and the anode of the other protecting element 200. Specifically, it is assumed that the element to be protected of which the two terminals are connected to the corresponding protecting elements respectively is turned off.

Figure 7A:
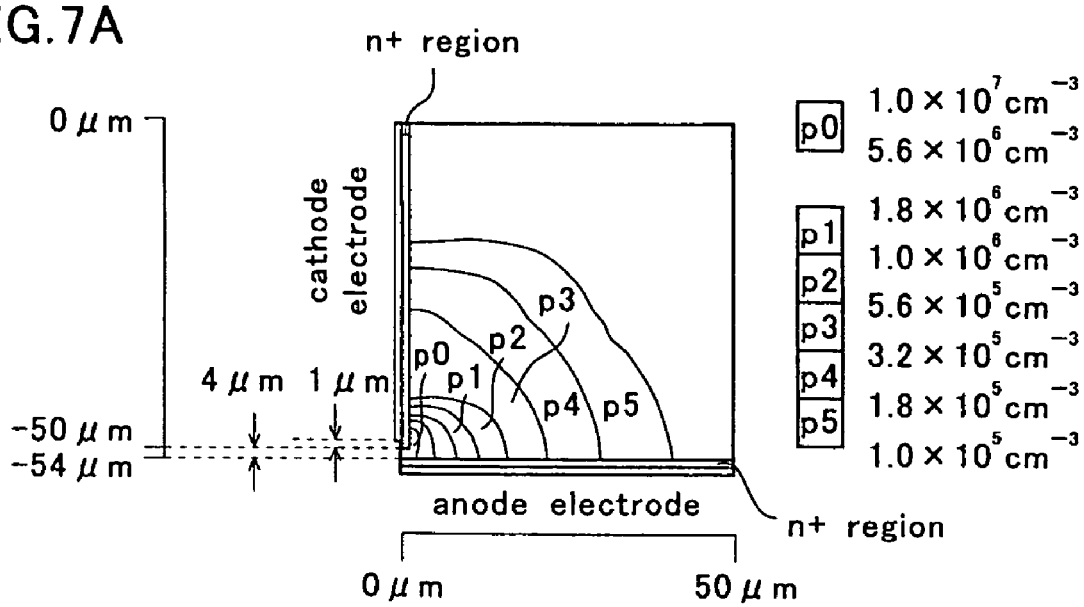
FIGS. 7A and 7B are views showing simulation results of the protecting element of the first embodiment of the present invention.
Figure 7B:
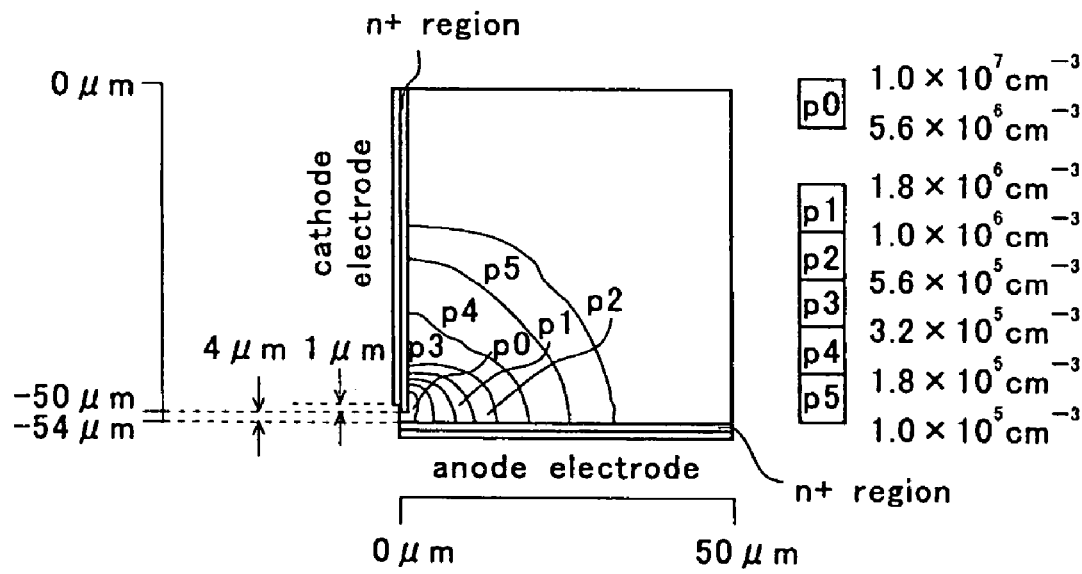

FIGS. 7A and 7B are cross-sectional views showing distributions of an electron current density and a hole current density in the region where the second current path I2 is formed by the TLP simulation. This is when static electricity is applied between the cathode and the anode of the protecting element of this embodiment and the static current 114.3 A leading to breakdown flows.

In the electron current density distribution shown in FIG. 7A, a region p0 is a region having the highest density (electron current density of $5.6 \times 10^6$ cm$^{-3}$ to $1.0 \times 10^7$ cm$^{-3}$) among the entire regions of the current paths including the first and the second current paths I1 and I2. Here, a total current is obtained by combining an electron current and a hole current, and the electron current is larger than the hole current. Specifically, in this embodiment, the electron current is set as a representative of the current, and regions having the electron current density of $1 \times 10^5$ cm$^{-3}$ or more (the regions p0 to p5) are defined as current paths of the protecting element 200. In other words, those regions are the first and second current paths I1 and I2 indicated by the arrows in FIGS. 1 and 5.

Here, the reason why the regions up to the region p5 are defined as the current paths is because it is found out by calculation of a current value distribution that a current having about 90% of a total current value flows in the regions p0 to p5. In other words, it is considered that there is no influence on operations in regions having the electron current density smaller than that of the region p5.

The hole current density distribution shown in FIG. 7B is similar to that shown in FIG. 7A. The fact that the hole current density distribution and the electron current density distribution approximately coincide with each other indicates that a static current value is increased since conductivity modulation occurs across the entire regions of the current paths when the static current flows.

Figure 8:
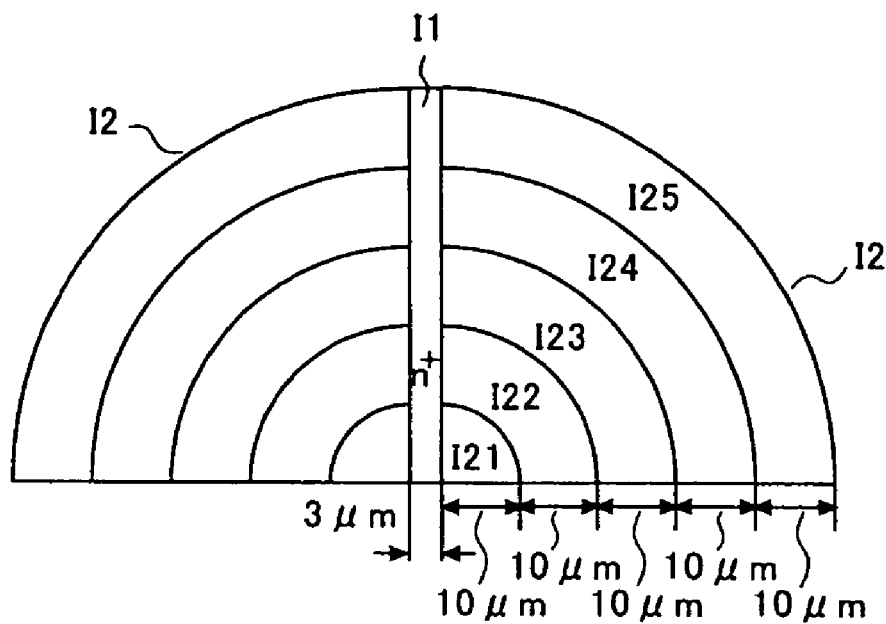
FIG. 8 is a view showing a current path of the protecting element of the first embodiment of the present invention.

FIG. 8 is a view showing the first and second current paths I1 and I2 of the protecting element 200. FIG. 8 shows results obtained by calculating a current value flowing through the first current path I1 and a current value flowing through the second current path I2 when the static current 114.3 A shown in FIG. 6 flows. As to the second current path I2, the entire path is divided into 5 sections (I21 to I25) every 10 µm, and current values flowing in the respective sections are calculated.

The current value flowing across all the regions forming a hemispherical shape with a diameter of 103 µm shown in FIG. 8 (as to the second current path I2, all the sections adding up to 50 µm) is 114.3 A. In this event, the current value of the second current path I2 is 76.9 A, and the current value of the first current path I1 is 37.4 A. Specifically, the current value of the second current path I2 is about twice the current value of the first current path I1. Thus, it is understood that the second current path I2 is much larger than the first current path I1.

Moreover, a total (I1+I2) current value including the sections I21 to I24 of the second current path I2 is 108.3 A, which is 95% of a whole total (I1+I2) current value including the sections I21 to I25 of the second current path I2 equal to 114.3 A. Furthermore, a total (I1+I2) current value including only the section I21 of the second current path I2 is 71.1 A, which is 62% of the whole total (I1+I2) current value including the sections I21 to I25 of the second current path I2 equal to 114.3 A. Specifically, the larger the insulating region 203 is secured, in which the second current path I2 is formed, the more the current can flow.

To be more specific, a sufficiently large area of the second n+ region 202 is secured relative to that of the first side S1, and the first side S1 may be disposed near the center of the second n+ region 202. Thus, the first and second current paths I1 and I2 can be formed to have a hemispherical shape by using the first n+ region 201 as the central axis.

Figure 9A:
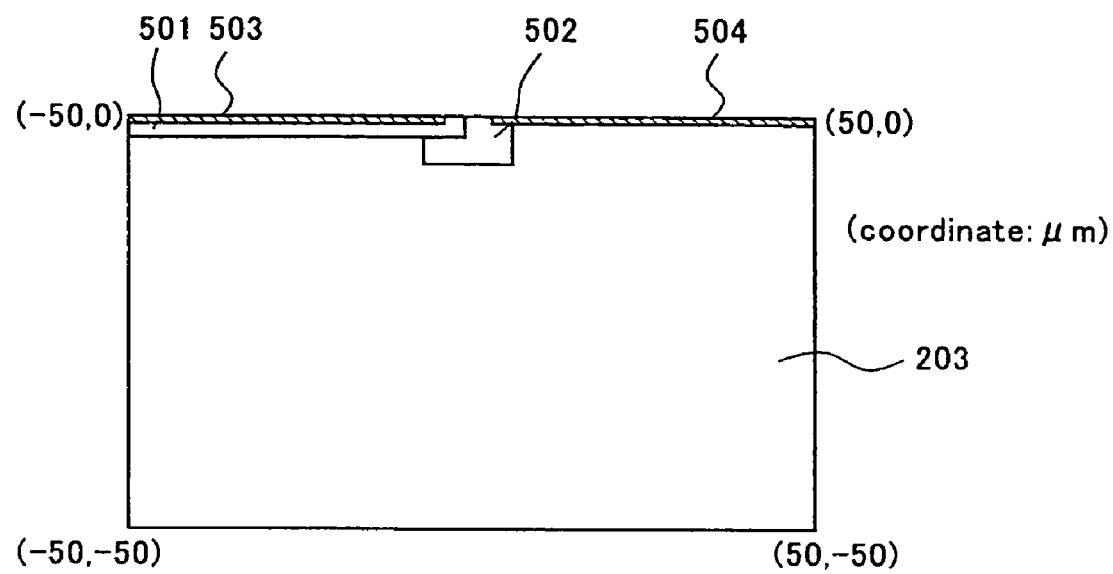
FIGS. 9A and 9B are views showing a simulation of a conventional structure.
Figure 9B:
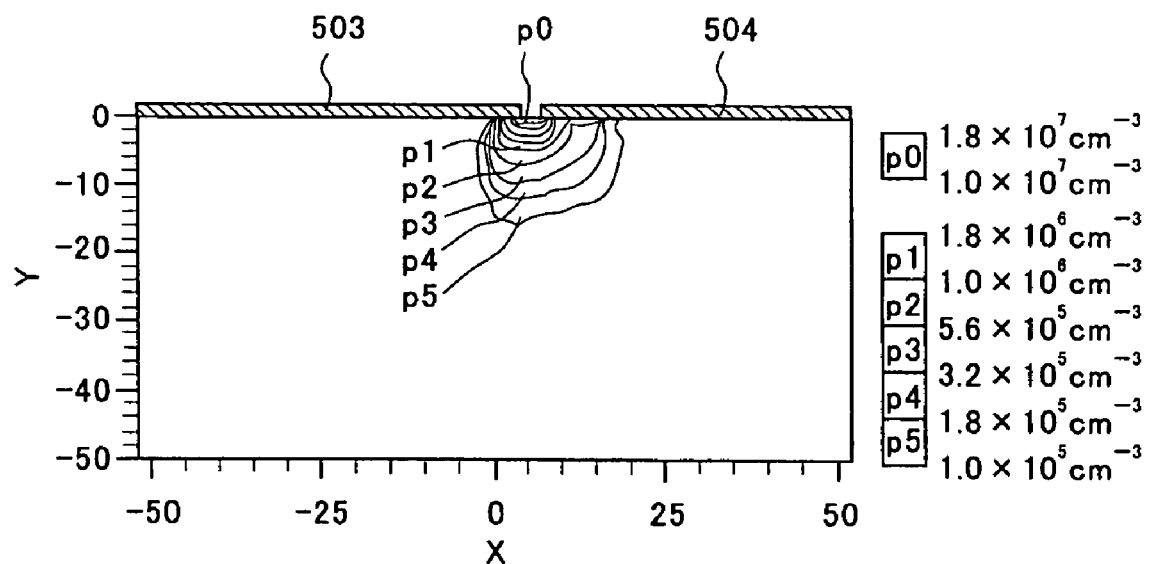

FIGS. 9A and 9B show results obtained by carrying out a simulation similar to that described above by using a pn junction diode that is a conventional protecting element. FIG. 9A is a cross-sectional view of a structure which is used for the simulation using the pn junction diode. This structure will be called a structure "a". FIG. 9B is a view showing a distribution of an electron current density.

As shown in FIG. 9A, as the structure "a", an n-type region 502 (an impurity concentration of $1 \times 10^{17}$ cm$^{-3}$) is formed to have a depth of 0.2 μm from a surface of a silicon substrate having an impurity concentration of $5 \times 10^{14}$ cm$^{-3}$ and a thickness of 50 μm. In addition, a p+ type region 501 having an impurity concentration of $3 \times 10^{18}$ cm$^{-3}$ is formed to have a depth of 0.02 μm from the surface so as to form a junction with the n-type region 502 over a distance of 4 μm. Moreover, a cathode electrode 504 and an anode electrode 503 are formed. As a result of a simulation of a Machine Model having a depth of 1 μm by use of the structure described above, it is found out that the diode is broken down at 0.45 A.

FIG. 9B is a cross-sectional view of an electron current density distribution when 0.45 A is applied in a TLP simulation. FIG. 9B shows that an electron current is concentrated in the vicinity of a pn junction. Specifically, the first current path I1 does not spread, the current per 1 μm in depth is 0.45 A, and a temperature of a high-density portion of the current reaches 80% of a silicon melt temperature. As a result, electrostatic breakdown occurs.

Normally, the pn junction diode is designed by use of only a current passing perpendicularly on a surface of the pn junction between the p+ type region 501 and the n-type region 502. Moreover, a space is not particularly secured around the diode, and no insulating region is provided around the diode. Thus, a current path corresponding to the second current path I2 of the protecting element 200 is hardly formed, and, even if the current path is formed, there is no influence on the result of the simulation.

Note that a capacity value when 2.4 V is applied between a cathode and an anode of the protecting diode described above is 2.73 fF. In the case of the protecting diode, the capacity value is directly set to be a value of a parasitic capacity since the cathode and the anode are connected between two terminals of an element to be protected, respectively.

Figure 10A:
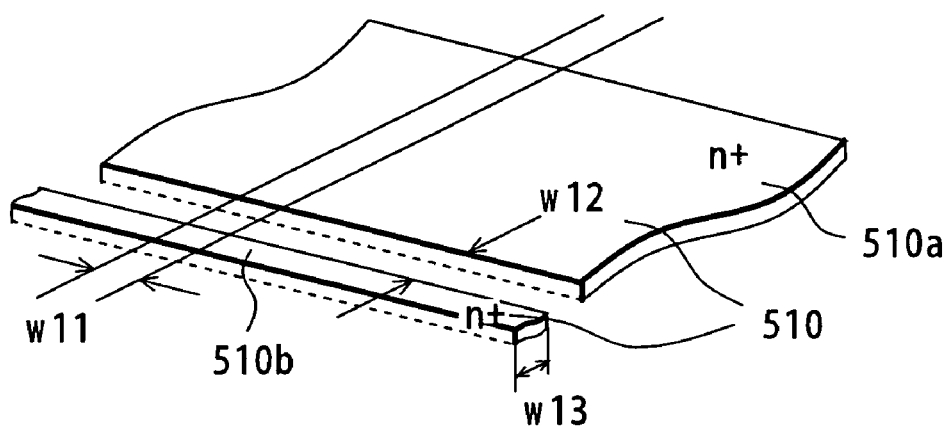
FIGS. 10A and 10B are views showing the simulation of the conventional structure.
Figure 10B:
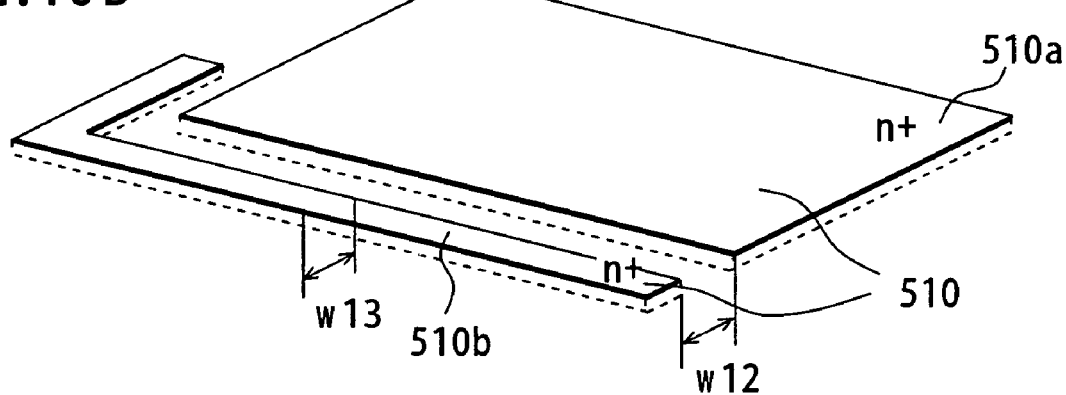
Figure 22:
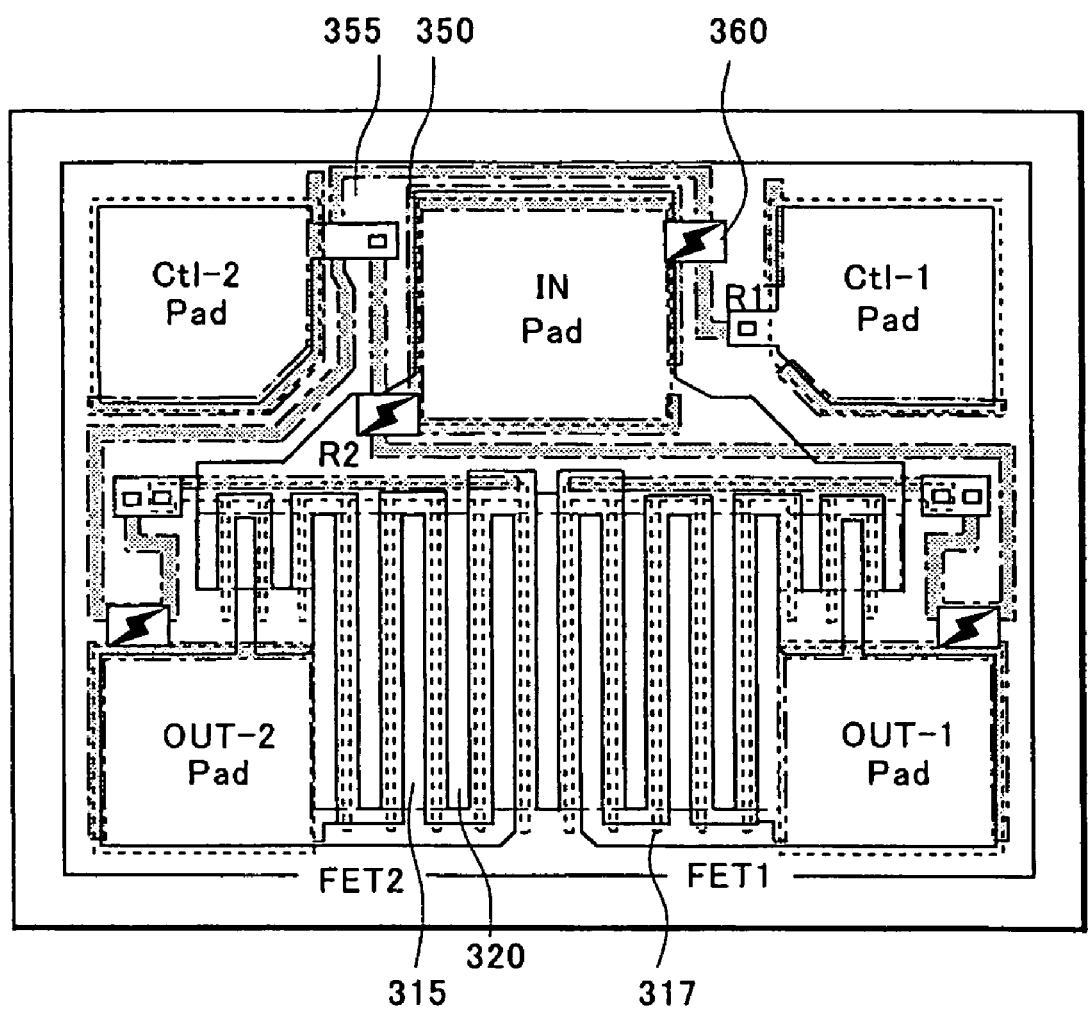
FIG. 22 is a view showing a conventional technology.
Figure 23:
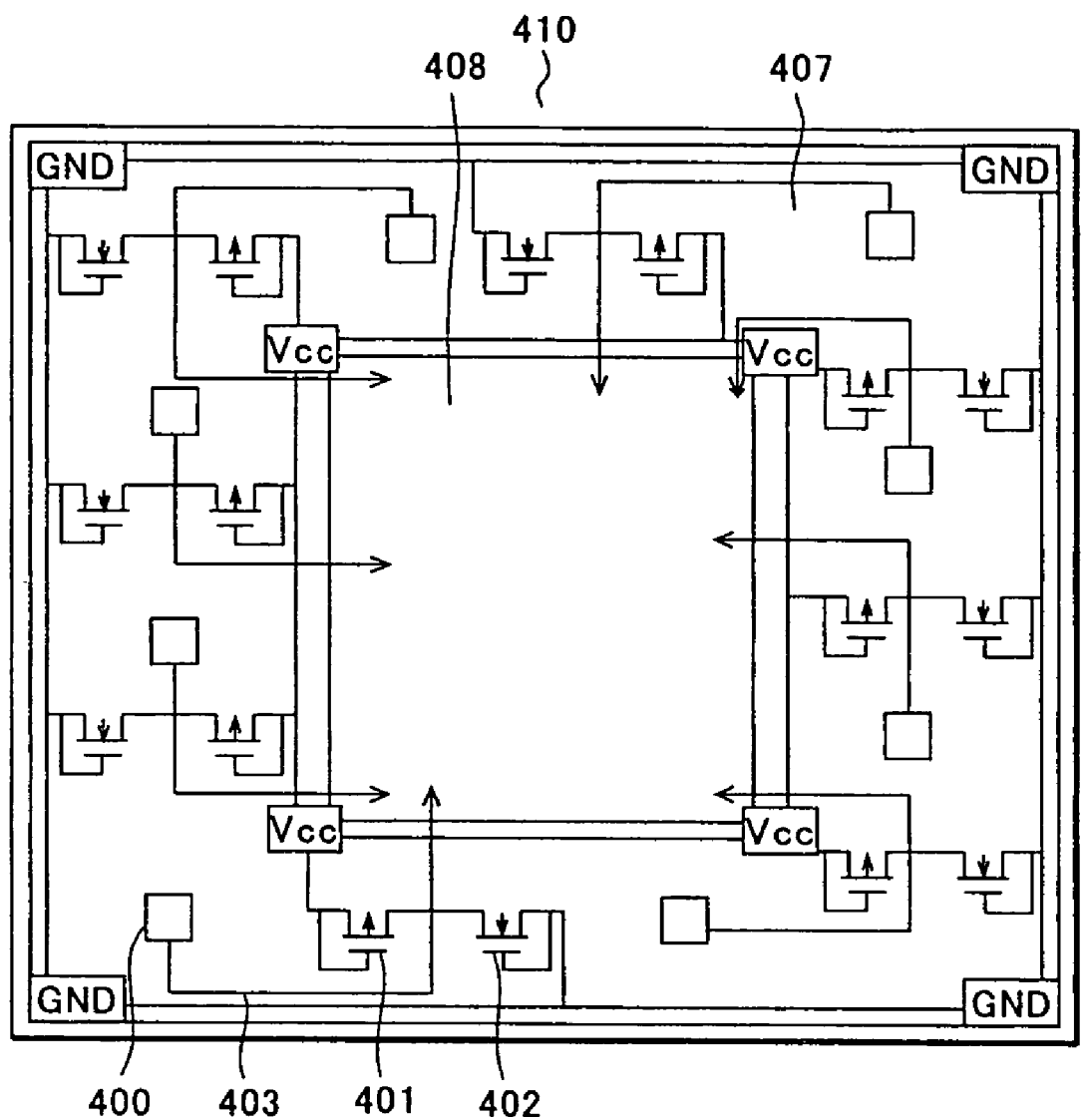
FIG. 23 is a view showing a conventional technology.

Furthermore, FIGS. 10A and 10B show a structure being used for carrying out a simulation of an n+/i/n+ protecting element disposed around an INPad in FIG. 22. In the conventional protecting element 360 shown in FIG. 22, a distance of an opposite face is set longer in order to enhance a protection effect. For comparing the structure described above to that of the protection element of this embodiment, calculations are performed by use of the structure shown in FIGS. 10A and 10B.

First, FIG. 10A shows the simplest n+/i/n+ structure in which an n+ region 510a below the pad and a resistor of an n+ region 510b are disposed so as to face each other for a long-distance. Since this structure is a two-dimensional structure, a simulation may be performed by cutting out a certain width and using the width as one unit. Specifically, in an application pattern as shown in FIG. 10B, it is estimated how many units a size of each shape corresponds to, and calculations are performed by multiplying the number of units by the above-described value for one unit.

In the simulation, calculations are performed in the following manner. Specifically, the two n+ regions 510 (510a and 510b) corresponding to an n+ region 350 below the pad and a resistor R, respectively, in FIG. 22 are disposed so as to face each other at a distance (w12) of 4 μm. In addition, a width w13 of the one n+ region 510b is set to 3 μm, which is equal to that of the resistor R. Accordingly, the simulation is performed by using a width w11 of this pattern=1 μm as the one unit described above. This structure of one unit will be called a structure "b" (FIG. 10A).

Since the calculated values of the pattern in FIG. 10A are proportional to a distance of an opposite face, values of a structure "c" (FIG. 10B) corresponding to an In-Pad portion in FIG. 22 can be calculated by multiplication from calculation results of the structure "b" as one unit. Specifically, since the distance of the opposite face in the case of FIG. 10B is 80 μm, the calculated values is 80 times the value of one unit.

The calculation described above is a calculation for the first current path I1. FIG. 10B shows only the first current path I1, and the calculated value is set to be the current value thereof. The current value of the structure "b" is calculated as 1.24 A, and the current value of the structure "c" is 99.2 A, which is 80 times that of the structure "b".

Note that a capacity value when 2.4 V is applied between a cathode and an anode of the structure "b" is calculated as 0.10 fF. In the case of the structure "c", a capacity value is 8.0 fF, which is 80 times that of the structure "b". In the case of the structures "b" and "c", the capacity value described above is directly set to be a value of a parasitic capacity since the cathode and the anode of the protecting element are connected, respectively, between the two terminals of the element to be protected.

FIG. 11 is a table showing the simulation results of the protection element 200 of this embodiment and the protecting elements having the structures "a" to "c" described above. The current values flowing at the time of electrostatic breakdown and the capacity values leading to deterioration of performance of the element to be protected by parasitizing the element to be protected are shown in the table.

A performance index of the electrostatic breakdown protecting element is indicated by "the current value/the capacity value". This indicates that how a large current is allowed to flow at a low parasitic capacity value. The larger the index is, the higher the performance of the protecting element is. When the indices are compared between the respective structures, the index of the structure "a" is as very small as 0.165, and the index of each of the structures "b" and "c" is 12.4.

Compared with the values described above, the performance index of the protecting element 200 of this embodiment is 90.0. Thus, it is clear that the protecting element 200 has a very high performance as a protecting element.

Note that an actual value of an electrostatic breakdown voltage of an actual device (FIG. 22) in the structure "c" is 1800 V. When this configuration is simulated by use of the Machine Model, the current value is 99.2 A as shown in the table of FIG. 11. It is considered that the two values described above are proportional to each other. Thus, 1800/99.2=18.1 (V/A) is a proportional factor of the actual value of the electrostatic breakdown voltage and the current value of the Machine Model simulation. This proportional factor is utilized when a protecting element is designed based on a required electrostatic breakdown voltage. This will be described later.

Figure 12:
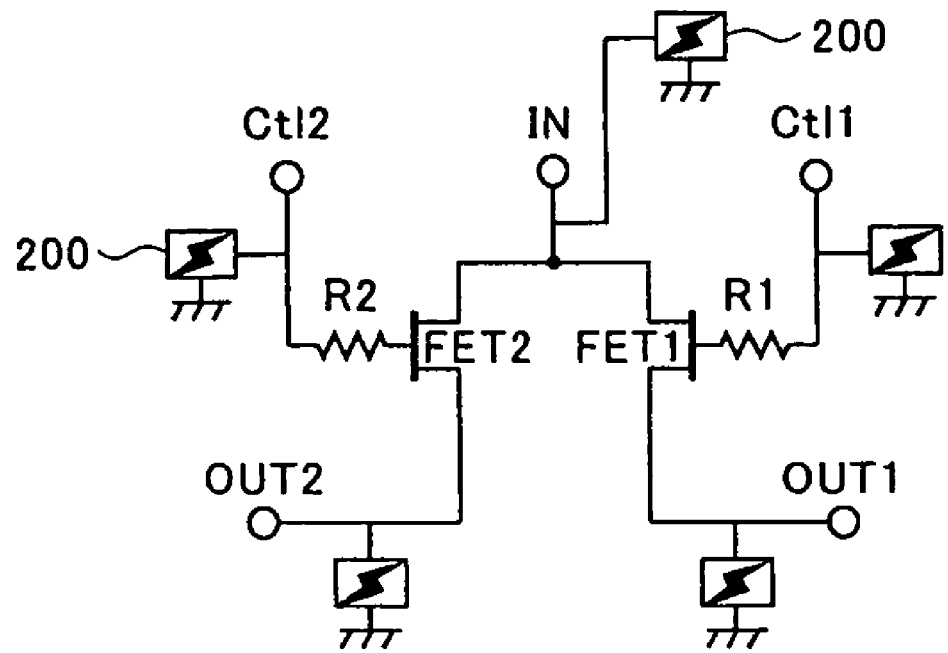
FIG. 12 is a circuit diagram of a semiconductor device of a second embodiment of the present invention.
Figure 13:
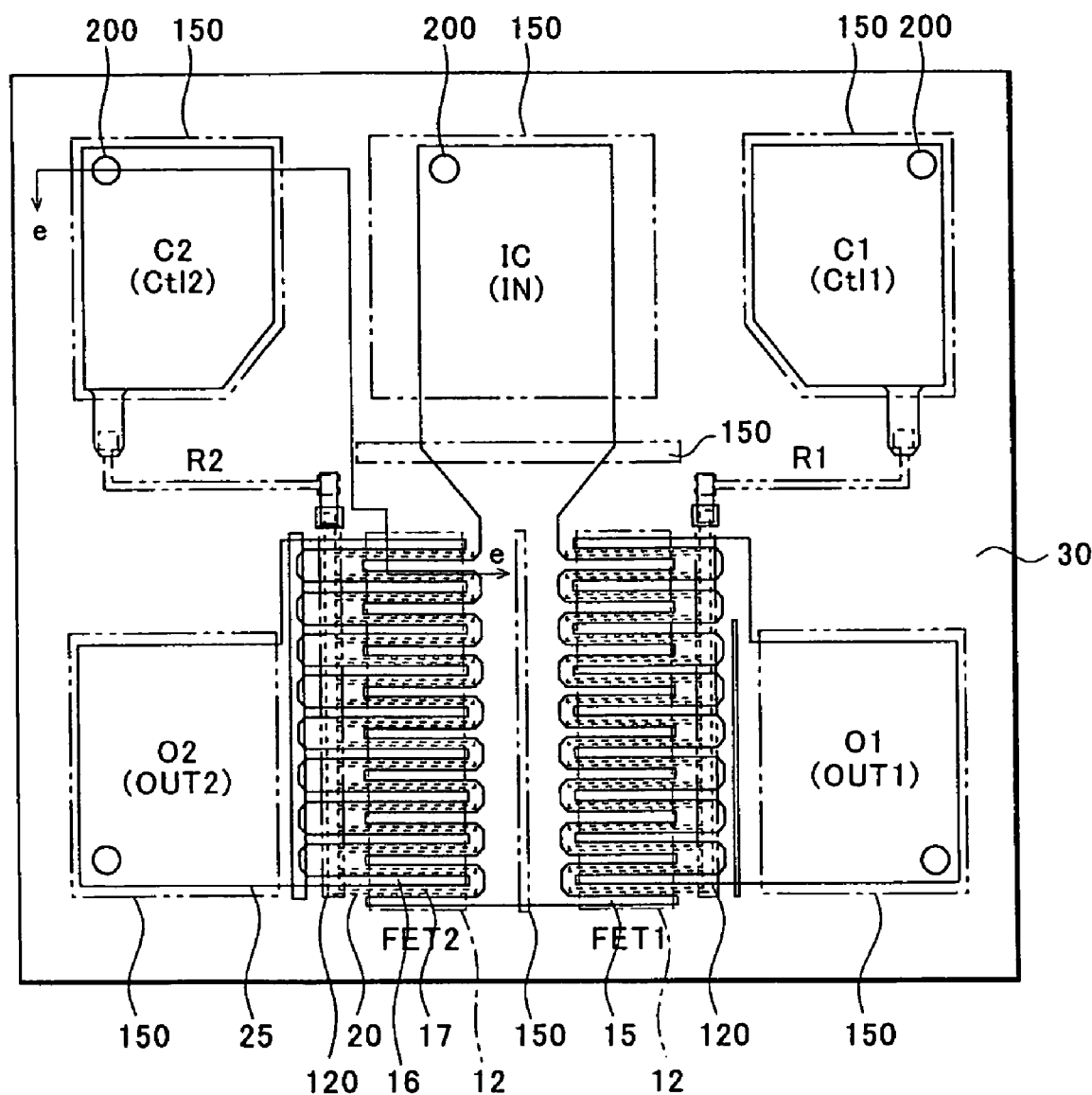
FIG. 13 is a plan view showing the semiconductor device of the second embodiment of the present invention.

With reference to FIGS. 12 to 16, a second embodiment of the present invention will be described. The second embodiment is an example of connecting a protecting elements 200 same as the first embodiment in a SPDT (single pole double throw) switch circuit device of a compound semiconductor. FIG. 12 is a schematic circuit diagram, and FIG. 13 shows a switch circuit device in which the circuit of FIG. 12 is integrated in one chip.

As shown in FIG. 12, the switch circuit device of the second embodiment is a basic SPDT switch circuit device. In the device, source electrodes (or drain electrodes) of first and second FETs 1 and 2 are connected to a common input terminal IN, gate electrodes of the FETs 1 and 2 are connected to first and second control terminals Ctl1 and Ctl2 through resistors R1 and R2, respectively, and the drain electrodes (or the source electrodes) of the FETs 1 and 2 are connected to first and second output terminals OUT1 and OUT2.

Control signals applied to the first and second control terminals Ctl1 and Ctl2 are complementary signals. One of the FETs, to which a H-level signal is applied, is turned on, and an input signal entering the common input terminal IN is transmitted to any one of the output terminals. The resistors R1 and R2 are disposed for the purpose of preventing leakage of a high-frequency signal through the gate electrodes to direct current potentials of the control terminals Ctl1 and Ctl2 to be AC-grounded.

When a signal is transmitted to the output terminal OUT1, for example, 3 V is applied to the control terminal Ctl1 and 0 V is applied to the control terminal Ctl2. On the other hand, when a signal is transmitted to the output terminal OUT2, a bias signal is applied by applying 3 V to the control terminal Ctl2 and 0 V to the control terminal Ctl1.

As shown in FIG. 13, the FETs 1 and 2 which perform switching are disposed in the center of a substrate 30. Note that, in this embodiment, description will be given by taking the case where a basic device is a HEMT as an example. In a periphery of the substrate 30, a plurality of pads P are disposed around the FETs 1 and 2. To be more specific, the pads P are pads IC, O1, O2, C1 and C2 corresponding to the common input terminal IN, the first and second output terminals OUT1 and OUT2, and the first and second control terminals Ctl1 and Ctl2. The resistors R1 and R2 are connected to the gate electrodes of the respective FETs. Note that a second metal layer indicated by the dotted line is a gate metal layer (Pt/Mo) 20 which is formed at the same time as formation of a gate electrode 17 of each of the FETs. A third metal layer indicated by the solid line is a pad metal layer (Ti/Pt/Au) 25 for connection of each element and formation of the pads. A first metal layer is an ohmic metal layer (AuGe/Ni/Au) which forms an ohmic junction with the substrate 30. The ohmic metal layer forms the source and drain electrodes of the respective FETs and extraction electrodes on both ends of the respective resistors. However, the ohmic metal layer is not shown in FIG. 13 since the layer is overlapped by the pad metal layer.

The gate electrode 17 of the FET1 and the first control terminal pad C1 are connected to each other through the resistor R1, and the gate electrode 17 of the FET2 and the second control terminal pad C2 are connected to each other through the resistor R2.

The pad metal layer 25 having a shape of 9 comb teeth extended toward the center of the chip is a drain electrode 16 (or a source electrode) which is connected to the first output terminal pad O1. Below the drain electrode 16, a drain electrode (or a source electrode) which is formed of the ohmic metal layer is provided. Moreover, the pad metal layer 25 having a shape of 9 comb teeth extended outward from the center of the chip is a source electrode 15 (or a drain electrode) which is connected to the common input terminal pad IC. Below the source electrode 15, a source electrode (or a drain electrode) which is formed of the ohmic metal layer is provided.

The both electrodes described above are arranged to have a shape in which the comb teeth are engaged with an operation region 12. Between the both electrodes, the gate electrode 17 formed of the gate metal layer 20 is disposed to have a shape of 17 comb teeth.

On the substrate 30, the operation region 12 is provided as indicated by a dashed-dotted line. Within the operation region 12, a source region and a drain region are formed and connected to the source electrode 15 and the drain electrode 16, respectively. Moreover, the gate electrode 17 forms a Schottky junction with a surface of the operation region 12 between the source and drain regions.

The gate electrode 17 of the FET1 has its comb teeth bundled by a gate wiring 120 outside the operation region 12 and is connected to the control terminal pad C1 through the resistor R1. Similarly, the gate electrode 17 of the FET2 also has its comb teeth bundled by the gate wiring 120 and is connected to the control terminal pad C2 through the resistor R2. The resistors R1 and R2 are formed of high-concentration impurity regions, respectively.

The respective pads P are formed of the pad metal layer 25, and, in the surface of the substrate 30 below the respective pads P, peripheral high-concentration impurity regions 150 (indicated by the dashed-double-dotted lines) are disposed, which are DC-connected to the pads P for improvement in isolation. The peripheral high-concentration impurity regions 150 are connected directly to the respective pads P and provided so as to protrude from the pads P in the entire surface of the substrate 30 below the pads P (or around the pads P). Moreover, the peripheral high-concentration impurity regions 150 may be provided around the pads P at a distance of about 5 µm or less from the pads P and DC-connected thereto through the substrate 30. If the distance is about 5 µm or less, it can be said that the pads P and the peripheral high-concentration impurity regions 150 are sufficiently DC-connected to each other.

Moreover, for the same reason, around the gate wiring 120, the peripheral high-concentration impurity region 150 is disposed, which is DC-connected to the gate wiring 120. The gate wiring 120 forms a Schottky junction with the substrate 30 as in the case of the gate electrode 17. Also in this case, the peripheral high-concentration impurity region 150 is provided so as to protrude from the gate wiring 120 in the entire surface of the substrate 30 below the gate wiring 120 (or around the gate wiring 120) or is provided around the gate wiring 120 at a distance of about 5 µm or less from the gate wiring 120.

The protecting elements 200 are provided below the respective pads P, and first n+ regions 201 of the protecting elements 200 are electrically connected to the respective pads P. In a chip rear surface to be a bottom of the substrate, second n+ region 202 is provided at least in a region facing the first n+ region 201. Moreover, a GND potential is applied to the second n+ region 202.

Thus, the protecting elements 200 can be connected to the common input terminal IN, the first and second control terminals Ctl1 and Ctl2, and the first and second output terminals OUT1 and OUT2 in the switch circuit device, respectively.

Figure 14A:
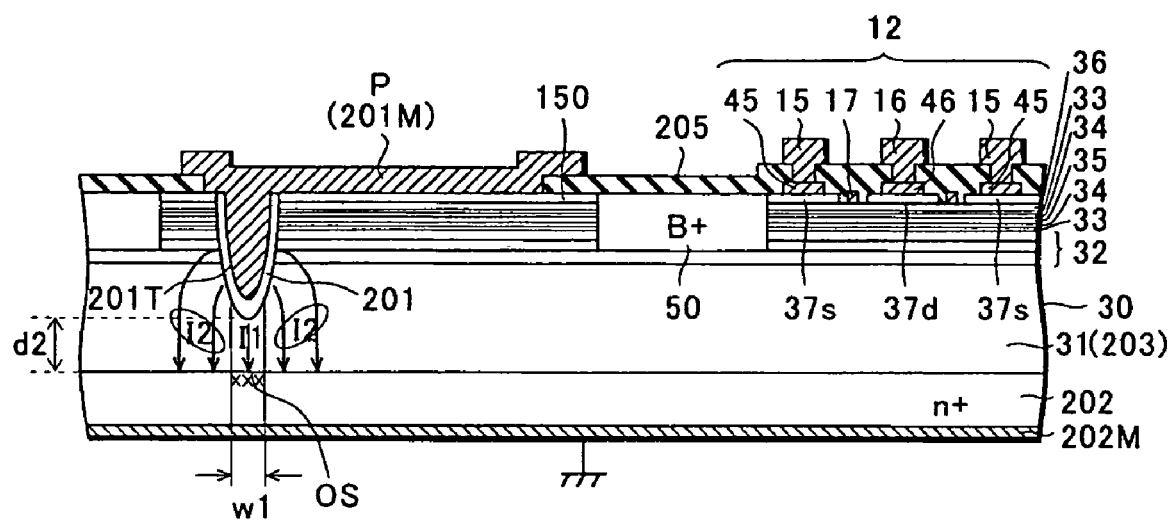
FIGS. 14A and 14B are cross-sectional views showing the semiconductor device of the second embodiment of the present invention.

With reference to cross-sectional views of FIGS. 14A and 14B, the operation region 12 and the protecting element 200 will be described. FIG. 14A is a cross-sectional view along the line e—e in FIG. 13 and shows a substrate structure of the HEMT. Moreover, all the pads P have the same configuration.

The substrate 30 of the HEMT is first formed by growing an undoped buffer layer 32 on a semi-insulating GaAs substrate 31. The buffer layer 32 is often formed of a plurality of layers. On the buffer layer 32, an n+ AlGaAs layer 33 to be an electron supply layer, an undoped InGaAs layer 35 to be a channel (electron transit) layer, and an n+ AlGaAs layer 33 to be an electron supply layer are sequentially grown. Moreover, between each of the electron supply layers 33 and the channel layer 35, a spacer layer 34 is disposed.

On the electron supply layer 33, an undoped AlGaAs layer 36 to be a barrier layer is grown to secure a predetermined breakdown voltage and a pinch-off voltage. Furthermore, an n+ GaAs layer 37 to be a cap layer is grown on the top. The metal layer such as the pad P, a source electrode 45 and a drain electrode 46 (or the extraction electrode of the resistor) is connected to the cap layer 37. By setting a high impurity concentration (about 1 to $5 \times 10^{18}$ cm$^{-3}$), a source resistance and a drain resistance are reduced, and ohmic characteristics are improved.

In the HEMT, electrons generated from donor impurities of the n+ AlGaAs layer 33 that is the electron supply layer move toward the channel layer 35 to form a channel to be a current path. As a result, the electrons and donor ions are spatially separated from each other on a heterojunction interface. The electrons move in the channel layer 35, in which the donor ions which cause reduction in electron mobility do not exist. Thus, there is hardly any influence of Coulomb scattering, and high electron mobility can be achieved.

Note that, in the second embodiment, the high-concentration impurity region of the HEMT means a region which is isolated by an insulating region 50 and in which the high-concentration cap layer 37 is not inactivated. The insulating region 50 is a region which is not completely electrically insulator and is insulated by ion-implanting impurities (B+) as shown in FIG. 14A to provide a carrier trap level in an epitaxial layer. For example, the operation region 12 is formed by isolating the region indicated by the dashed-dotted line in FIG. 13 by use of the insulating region 50. Although the impurities also exist in the insulating region 50 as the epitaxial layer, the impurities are inactivated by implanting B+. Note that an insulating region 203 of the protecting element 200 is formed of the buffer layer 32 and the semi-insulating GaAs substrate 101. Therefore, in this case, a second-current path I2 is formed between a second side S2 and the second n+ region 202 below the buffer layer 32.

Specifically, in the HEMT, a necessary pattern is formed by isolating the substrate 30 by use of the insulating region 50 selectively formed on the substrate 30. Therefore, a source region 37s, a drain region 37d, the peripheral high-concentration impurity region 150 and the resistor R1 and R2 are the same as an epitaxial layer structure of the HEMT and includes the cap layer 37 (the impurity concentration of about 1 to $5 \times 10^{18}$ cm$^{-3}$). Thus, they can be functionally equivalent to the high-concentration impurity region.

The source electrode 45 and the drain electrode 46 which are formed of the ohmic metal layer are connected to the cap layer 37 on the substrate 30, which is to be the source region 37s and the drain region 37d, in the operation region 12. On the source and drain electrodes 45 and 46, the source and drain electrodes 15 and 16 are formed of the pad metal layer 25.

Moreover, the gate electrode 17 formed of the gate metal layer 20 is disposed on the undoped AlGaAs layer 36 exposed by etching a part of the operation region 12, that is, the cap layer 37 between the source region 37s and the drain region 37d.

A trench 201T is provided below each of the pads P, and the first n+ region 201 is provided along the periphery of the trench 201T. Specifically, a metal layer 201M is the pad P, and the pad metal layer 25 is buried in the trench 201T to connect the first n+ region 201 to the pad P.

Figure 14B:
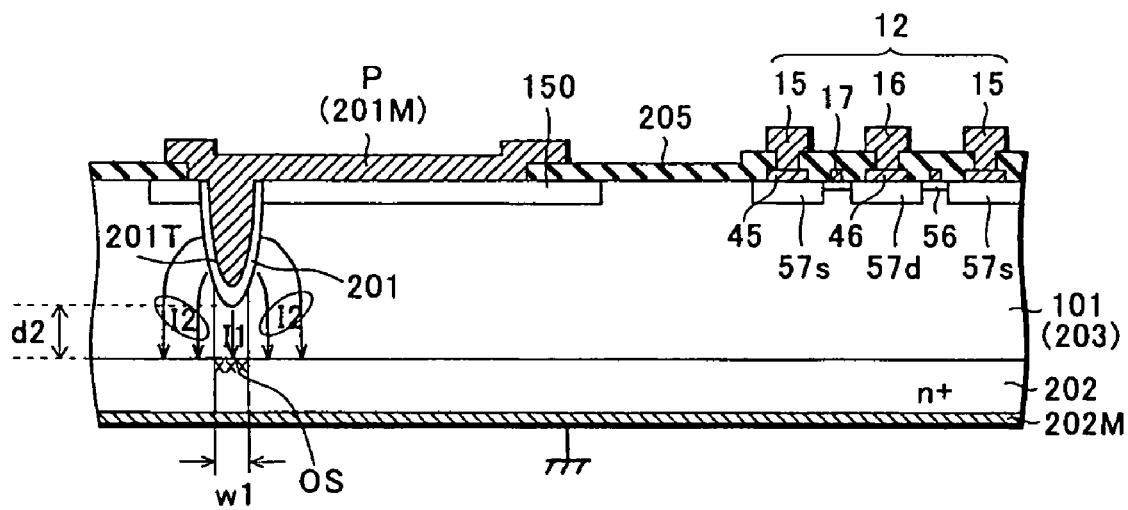

Note that, here, as shown in FIGS. 14A and 14B, the trench 201T having shallowly curved sidewall and bottom is adopted. The straight trench 201T formed by anisotropic etching as shown in FIGS. 1B to 1D requires oblique ion implantation if the first n+ region 201 is formed by ion implantation.

Meanwhile, by forming the trench 201T to have a slightly sloping inner wall as shown in FIGS. 14A and 14B, the first n+ region 201 can be formed even by ion implantation in a direction perpendicular to a wafer.

Furthermore, in the chip rear surface to be the bottom of the substrate, for example, in the entire surface thereof, the second n+ region 202 is provided, which is disposed so as to face the first side S1 of the first n+ region 201 at a distance d2 of 4 μm. Moreover, on the chip rear surface, the metal layer 202M which comes into contact with the second n+ region 202 is formed by evaporation and the like, and the GND potential is applied thereto.

Same as the first embodiment, in the insulating region 203 around the both terminals, the first and second n+ regions 201 and 202, during the discharge, a first current path I1 and a second current path I2 are formed as indicated by the arrows in FIG. 14A. By connecting the protecting elements 200 to all the terminals, respectively, as described above, even if static electricity is applied to any of the terminals, the static electricity can be discharged to the GND potential through the first and second current paths I1 and I2. Therefore, the static electricity can be discharged to the GND potential before entering the operation region 12.

Moreover, since the protecting elements 200 are disposed below the pads P, absolutely no space is required for the protecting elements 200 in the pattern on the chip. Therefore, even if the protecting elements 200 are connected to all the pads P to which the static electricity may be applied, a chip area can be maintained to be the same as that of the case without connecting the protecting elements 200.

Moreover, as described above, in the FET, a portion of the Schottky junction between the gate electrode 17 and the operation region 12 has the lowest electrostatic breakdown voltage. Specifically, when electrostatic energy applied between the gate terminal and the drain terminal or between the gate terminal and the source terminal reaches a gate Schottky junction, if the electrostatic energy which has reached exceeds the electrostatic breakdown voltage between the gate electrode 17 and the source electrode 45 or between the gate electrode 17 and the drain electrode 46, the gate Schottky junction is broken down.

In this embodiment, the protecting elements 200 are connected to the common input terminal IN, the first and second control terminals Ctl1 and Ctl2, and the first and second output terminals OUT1 and OUT2 in the switch circuit device, respectively. Thus, before electrostatic energy applied between the common input terminal IN and the first control terminal Ctl1 or the second control terminal Ctl2 reaches between the corresponding gate electrode 17 and the source electrodes 15 of FET1 and FET2 in common, the electrostatic energy can be discharged to the GND potential. Moreover, before the electrostatic energy reaches between the gate electrode 17 and the drain electrode 16, the electrostatic energy can be discharged to the GND potential.

FIG. 14B is a cross-sectional view of an MMIC including an ion-implantation-type GaAs FET. The switch circuit device shown in FIG. 13 may be the MMIC including the GaAs FET. In other words, a plan view of FIG. 14B is the same as FIG. 13, and a substrate structure is different.

The operation region 12 is formed by implanting n-type impurities into the GaAs substrate 101. Specifically, a source region 57s and a drain region 57d, which are formed of high-concentration n-type impurities, are formed in a channel layer 56 formed of the n-type impurities. The source electrode 45 and the drain electrode 46, which are formed of the ohmic metal layer, are connected to the source region 57s and the drain region 57d, respectively. On the source and drain electrodes 45 and 46, the source and drain electrodes 15 and 16 are formed of the pad metal layer 25. Moreover, on the channel layer 56 between the source region 57s and the drain region 57d, the gate electrode 17 is formed of the gate metal layer 20.

In the case of the GaAs MMIC, in the entire surface of the substrate 101 below the pad P (or around the pad P), a peripheral high-concentration impurity region 150 is provided, into which impurities are ion-implanted.

Figure 15:
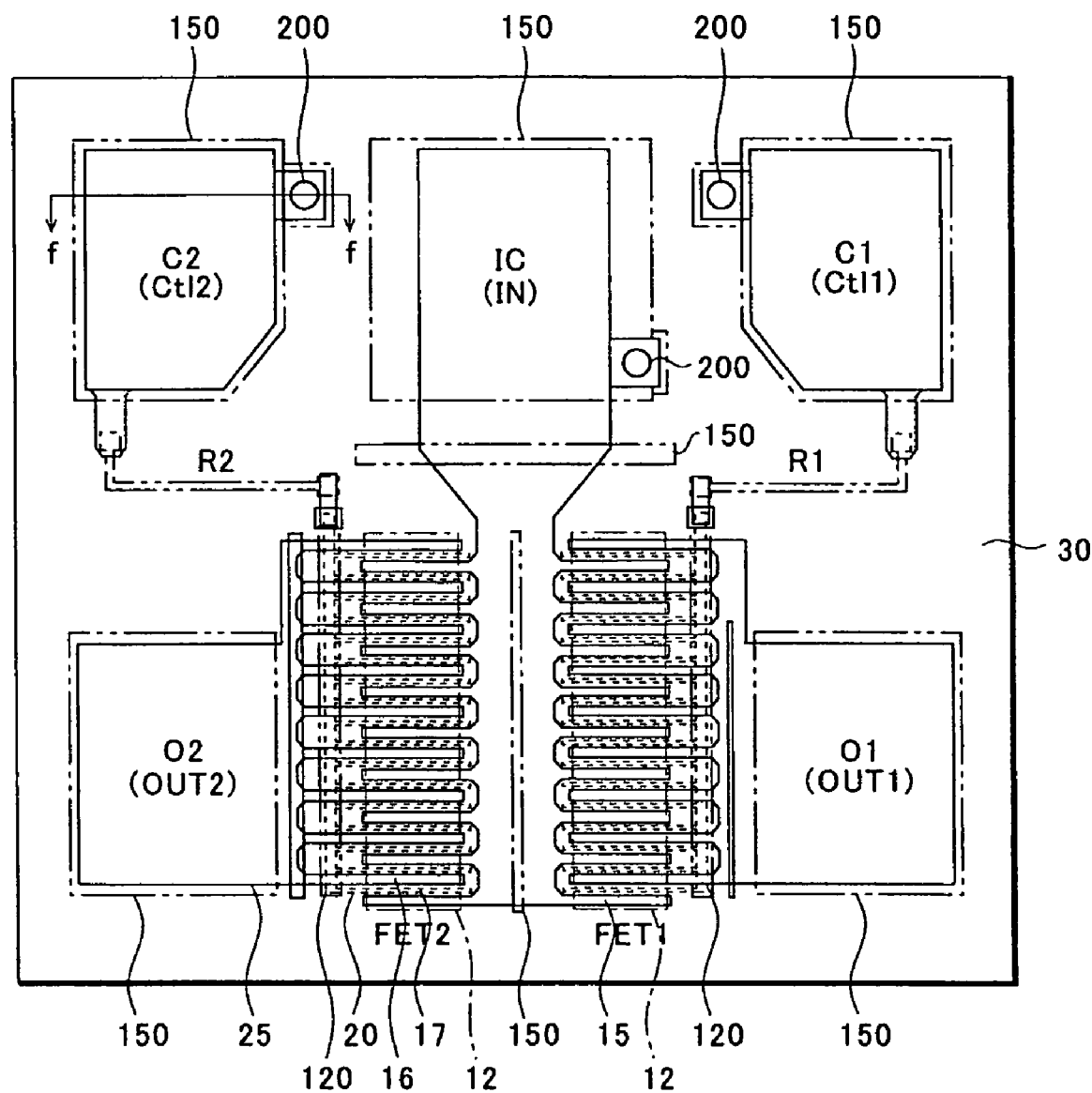
FIG. 15 is a plan view showing a semiconductor device of the second embodiment of the present invention.
Figure 16:
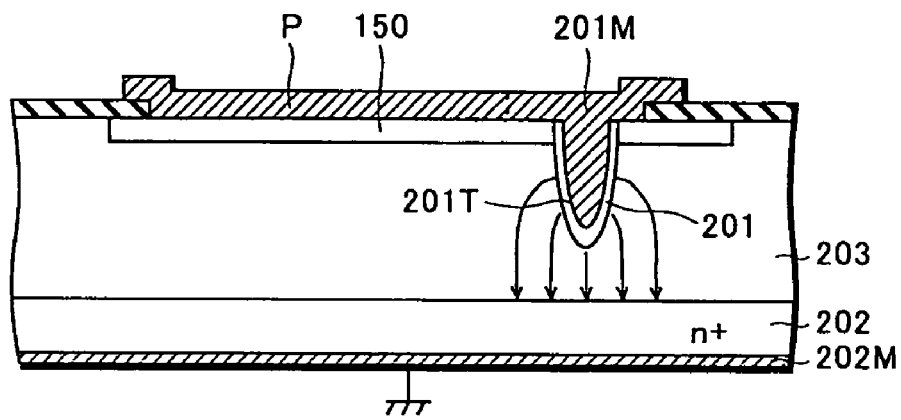
FIG. 16 is a cross-sectional view showing the semiconductor device of the second embodiment of the present invention.

FIGS. 15 and 16 show another embodiment of the switch circuit device shown in FIG. 13. FIG. 15 is a plan view and FIG. 16 is a cross-sectional view along the line f—f in FIG. 15. Note that FIG. 16 shows the case of the MMIC including the GaAs FET. If a substrate has the HEMT structure, the same substrate structure as that of FIG. 14A is obtained.

As shown in FIG. 16, the protecting element 200 may be connected below the metal layer 201M connected to the pad P. The area of the metal layer 201M is sufficient as long as the area overlaps the first n+ region 201. The protecting element 200 can be connected by utilizing a space around the pad.

In the embodiments, since a width w1 of an opposite face OS of a second n+ region which faces a first side S1 of the first n+ region is small, the device has only a very small parasitic capacity. Meanwhile, since a second current path I2 has ability to flow a very large static current, the device has a very substantial electrostatic breakdown protection effect.

Particularly, in the case of the HEMT, an insertion loss of the basic device is small compared to the GaAs FET. Thus, if there is a spot where even a slight high-frequency signal leak in a high-frequency signal path within the chip, the insertion loss as the switch circuit device is significantly increased. Moreover, since the insulating region 203 is not completely electrically insulator, a depletion layer is extended in the insulating region 203 and a signal leaks due to a change in the depletion layer.

However, according to the embodiments, by reducing the area of the opposite face OS in the protecting element 200, a parasitic capacitance in this portion can be reduced. Therefore, leakage of the high-frequency signal can be prevented, and the electrostatic breakdown can be prevented without increasing the insertion loss.

Note that FIG. 16 shows that the pad P has a one-layer structure including only the pad metal layer 25. However, the pad P may have a two-layer structure in which the gate metal layer 20 and the pad metal layer 25 are evaporated in this order on the substrate or may have a two-layer structure in which the pad metal layer 25 is further plated with gold.

In the wireless communication market such as a portable telephone, there is a need for a guarantee of 100 V or more as an electrostatic breakdown voltage value in a Machine Model. However, it has been heretofore impossible to realize a pHEMT switch capable of guaranteeing the electrostatic breakdown voltage value of 100 V or more. Thus, in order not to cause electrostatic breakdown in a pHEMT switch integrated circuit device, for example, measures have been taken such as externally connecting inductors to a common input terminal IN and an output terminal OUT.

However, matching is lost by externally connecting the inductors, and a problem of an increased insertion loss has arisen. Moreover, a mounting area has been increased and a cost has been increased due to a relatively expensive inductor compared with a capacitor and a resistor, and the like.

Since the electrostatic breakdown voltage of the switch integrated circuit device cannot be measured without destruction test, the good products of the device which has higher electrostatic breakdown voltage than 100V can not be selected before shipment. Thus, there is no other way than to meet market needs for the electrostatic breakdown voltage value of 100 V in design assurance. However, in order to guarantee 100 V, about 800 V is required as ability.

Here, as described above, in the structure "c" shown in FIG. 10B, the proportional factor of the current value, which is to be the proportional factor of the actual value of the electrostatic breakdown voltage and the current value of the Machine Model simulation, is 18.1 (V/A). Specifically, in order to guarantee the electrostatic breakdown voltage of 800 V, a protecting element having ability of the Machine Model simulation current value of 800/18.1 (proportional factor)=44.2 A is required. In general, the more the size of the protecting element is increased, the more the protection effect is increased. Thus, it is easy to obtain the Machine Model simulation current value of 44.2 A.

However, if the size of the protecting element is simply increased the insertion loss may be deteriorated by a parasitic capacity included in the protecting element. It is a problem that connection of the protecting elements increases the insertion loss of the pHEMT switch characterized by having a low insertion loss.

To be more specific, an off capacity of the pHEMT switch is about 90 fF. Accordingly, unless the protecting element is one having a negligible parasitic capacity of about 1 fF or less, for example, with respect to the off capacity value described above, the insertion loss is increased by connection of the protecting elements. For example, when the pHEMT switch is formed by use of the pattern shown in FIG. 22, the insertion loss is increased by 0.15 dB at 2 GHz compared with the insertion loss of the original pHEMT switch.

In the pattern shown in FIG. 22, the protecting element having the structure "c" is connected between the common input terminal pad IN Pad and the control terminal pad Ctl-1 Pad or between the common input terminal pad IN Pad and the control terminal pad Ctl-2 Pad.

The capacity value of the protecting element having the structure "c" is 8.0 fF (see FIG. 11). As described above, when the capacity value reaches a nonnegligible level with respect to the off capacity 90 fF of the pHEMT switch, the insertion loss is increased.

Specifically, as a performance index(the current value/the capacity value), the protecting element having 44 (A)/1 (fF)=44 or more is required. The protecting element 200 of the embodiments have the performance index of 90 and can sufficiently meet this requirement.

Moreover, the protecting element 200 of this embodiment has the current value of 114.3 A, which is sufficiently larger than the Machine Model simulation current value of 44.2 A, and has the parasitic capacity value of 1.27 fF, which is about 1 fF or less. The current value and the capacity value can both meet the requirements described above.

Note that the embodiments can be applied in a reverse type of the switch circuit device in which the first control terminal Ctl1 is connected to the gate electrode 17 of the FET2 and the second control terminal Ctl2 is connected to the gate electrode 17 of the FET1. In the device, when a signal is transmitted to the output terminal OUT1, for example, 3V is applied to the second control terminal Ctl2 and 0V is applied to the first control terminal Ctl1. On the other hand, when a signal is transmitted to the second output terminal OUT2, a bias signal of 3V is applied to the first control terminal Ctl1 and the bias signal of 0V is applied to the second control terminal Ctl2.

Moreover the embodiment can be applied in a high power switch circuit device in which there are plural FETs, for example FET1-1, FET1-2 and FET1-3, connected each other in series, instead of FET1 in the circuit device of FIGS. 12 to 16. Specifically, a source electrode of FET1-1 is connected to a common input terminal IN, a drain electrode of FET1-1 is connected to a source electrode of FET1-2, a drain electrode of FET1-2 is connected to a source electrode of FET1-3 and a drain electrode of FET1-3 is connected to a first output terminal OUT1. And gate electrodes of FET1-1,1-2 and 1-3 are connected to a first control terminal Ctl1 through resistors R1-1,1-2 and 1-3 respectively. Similarly there are plural FETs, for example FET2-1, FET2-2 and FET2-3, connected each other in series, instead of FET2 in the circuit device of FIGS. 12 to 16, a source electrode of FET2-1 is connected to a common input terminal IN, a drain electrode of FET2-3 is connected to a second output terminal OUT2, gate electrodes of FET2-1,2-2 and 2-3 are connected to a second control terminal Ctl2 through resistors R2-1,2-2 and 2-3 respectively.

The embodiments have been described above by taking, as an example, the case of the substrate structure in which the insulating region 203 includes the buffer layer of the HEMT or the case of the GaAs semi-insulating substrate. However, the embodiments can also be applied to a silicon substrate. In that case, as the insulating region 203, a region insulated by implanting or diffusing impurities into the substrate is formed. Moreover, the insulating region may be formed of polysilicon.

Figure 17:
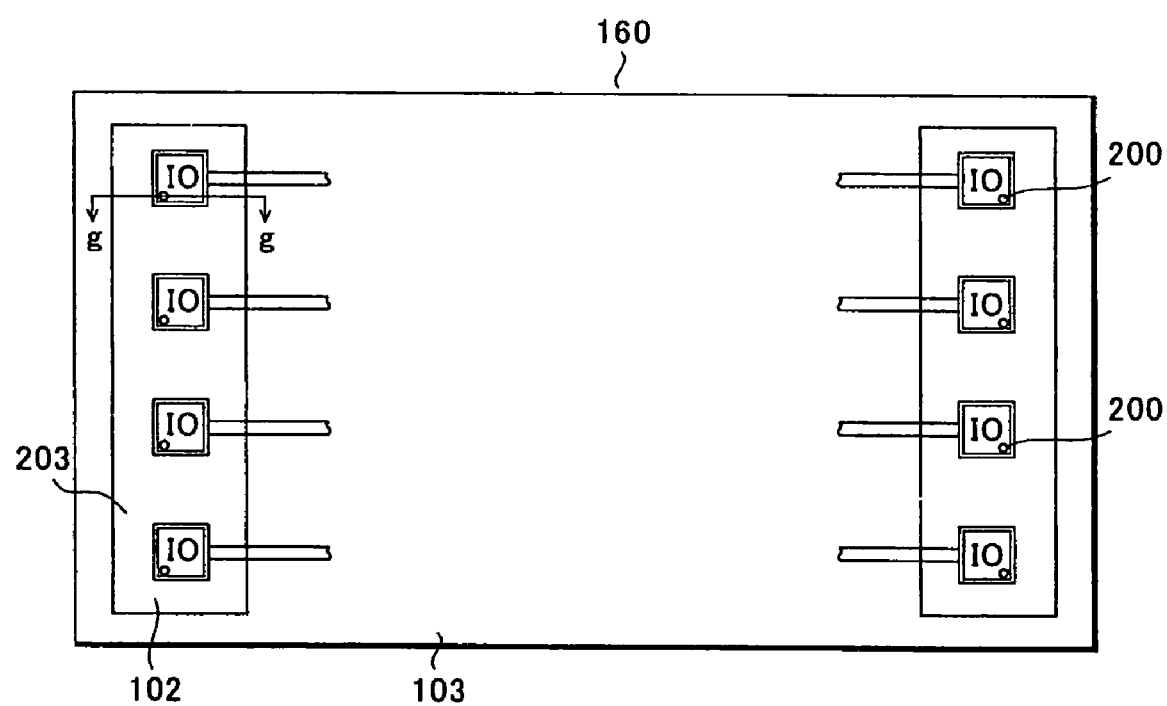
FIG. 17 is a plan view showing a semiconductor device of a third embodiment of the present invention.
Figure 18:
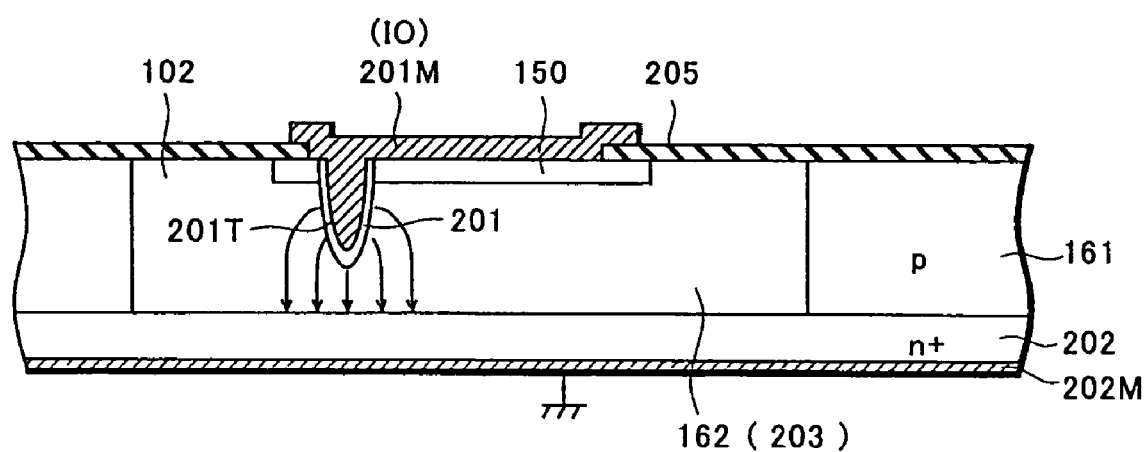
FIG. 18 is a cross-sectional view showing the semiconductor device of the third embodiment of the present invention.

With reference to FIGS. 17 and 18, a third embodiment of the present invention will be described. Protecting elements 200 same as the first embodiment can also be connected to an integrated circuit device (hereinafter called an LSI) in which a logic circuit is formed by use of MOSFETs and the like as basic elements.

FIG. 17 is a plan view. A semiconductor device of the third embodiment is formed by integrating a logic circuit element and protecting elements on the same substrate. To be more specific, the semiconductor device has a configuration including a logic circuit region 103 disposed in the center portion and a protecting element region 102 provided in a peripheral portion of the logic circuit region 103.

The logic circuit region 103 is disposed near the center portion of the semiconductor device, and the logic circuit is a CMOS logic circuit including n-channel MOSFETs and p-channel MOSFETs, for example. The CMOS logic circuit is formed of various patterns so as to perform desired operations and is not shown in FIG. 17 here.

Moreover, in the protecting element region 102 surrounding the periphery of the logic circuit region 103, a plurality of input/output terminal pads IO for signals are disposed, which are connected to the logic circuit. Below the input/output terminal pads IO, the protecting elements 200 are disposed. A first n+ regions 201 are connected to the input/output terminal pads IO. A second n+ regions 202 of the protecting elements 200 are provided on a rear surface of the substrate, and a GND potential is applied thereto.

FIG. 18 is a cross-sectional view along the line g—g in FIG. 17.

The logic circuit region 103 is formed in a p-type substrate 161. The protecting element region 102 is a region in which trenches are formed in the p-type substrate and an undoped polysilicon 162 is buried. In the protecting element region 102, the input/output terminal pads IO and the protecting elements 200 are disposed.

In the surface of the substrate(the undoped polysilicon 162) below (or around) the input/output terminal pad IO, a peripheral high-concentration impurity region 150 is provided. Moreover, a trench 201T is provided, and the first n+ region 201 is disposed along the periphery of the trench 201T. A metal layer 201M forms the input/output terminal pad IO, and, at the same time, the metal layer 201M is buried in the trench 201T and connected to the first n+ region 201.

In the bottom of the substrate 161, the second n+ region 202 is disposed so as to face the first n+ region 201 at a distance d2 of 4 µm. A metal layer 202M contacts with the rear surface of the substrate 161 and the GND potential is applied thereto. Thus, static electricity entering the input/output terminal of the logic circuit can be discharged.

The n-channel MOSFET and the p-channel MOSFET, which are included in the CMOS logic circuit, have a structure weak in electrostatic breakdown since a gate oxide film is made thinner and a gate length is made shorter along with improvement in performance. Therefore, by disposing the protecting element region 102 around the logic circuit region 103, static electricity can be discharged before the static electricity enters the logic circuit region.

It has been very problematic that a protecting element region in which a CMOS buffer circuit type protecting circuit is provided is large compared with a logic circuit region. Specifically, in the CMOS buffer circuit type protection circuit, a ggnMOS (gate grounded nMOS) and a ggpMOS (gate grounded pMOS) are connected. However, according to this embodiment, it is possible to allow a large static current to flow by connecting the protecting element 200 below the input/output terminal pad IO. Therefore, an area of the protecting element region 102 can be significantly reduced as long as an area required for disposition of the input/output terminal pads IO is secured. Moreover, since a parasitic capacity is small, an element to be protected (the LSI) can be surely protected from static electricity without reducing a computation processing speed of the logic circuit element.

Moreover, in the case of a silicon LSI in which the logic circuit element and the protecting elements are integrated in one chip as described above, it is often difficult to form an insulating region 203 in the substrate 161. In such a case, high-resistance polysilicon 162 is provided in the protecting element region 102 and set to be the insulating region 203. In the insulating region 203, the protecting element 200 having the n+/i/n+ structure may be formed.

Although not shown in FIGS. 17 and 18, on a chip 160 described above, a passivation film such as a silicon nitride film, a silicon oxide film and a polyimide insulating film is formed so as to cover the pads provided in the peripheral portion. Moreover, each of the pads IO has an opening in its upper portion for bonding connection.

Furthermore, for example, the chip 160 is die-bonded to an island of a lead frame by use of an adhesive. Moreover, one end of a bonding wire such as a metal wire is wire-bonded by ball bonding to each of a power supply terminal pad and a ground terminal pad (neither of which is shown) and the input/output terminal pad IO on the chip 160. The other end of the bonding wire is wire-bonded by stitch bonding to a tip portion of a corresponding lead for external derivation.

Figure 19:
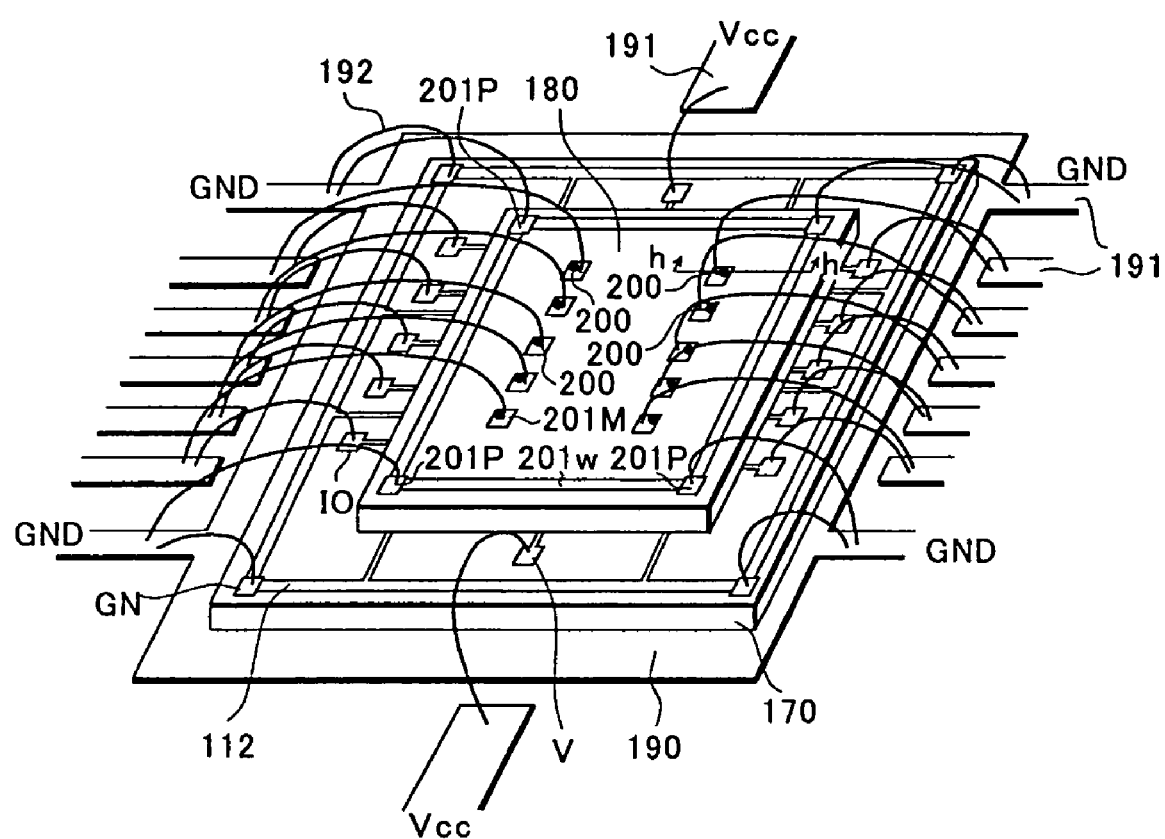
FIG. 19 is a perspective view showing a semiconductor device of a forth embodiment of the present invention.
Figure 20:
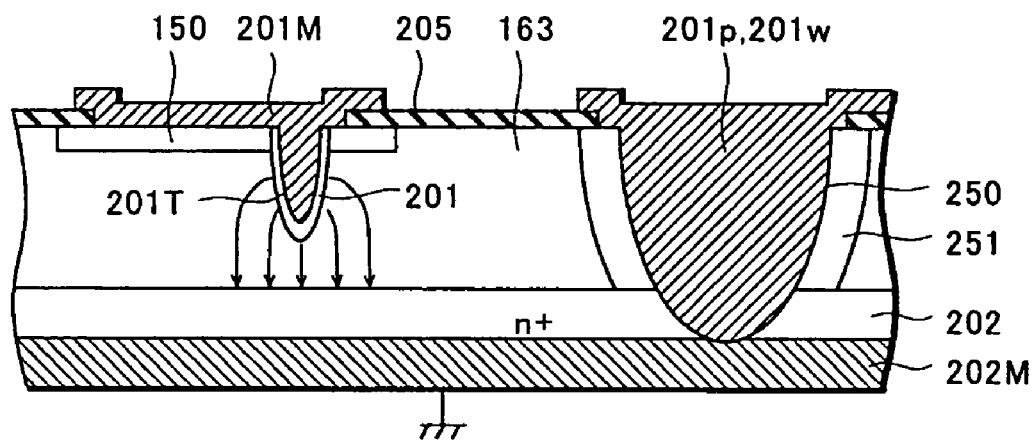
FIG. 20 is a cross-sectional view showing the semiconductor device of the forth embodiment of the present invention.
Figure 21:
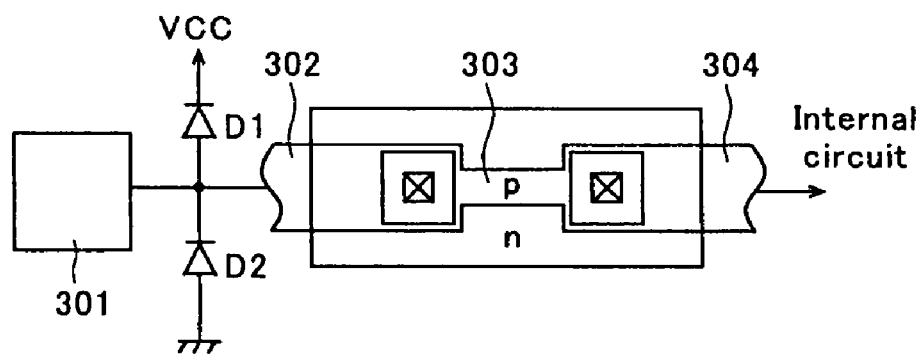
FIG. 21 is a view showing a conventional technology.

FIGS. 19 and 20 show a fourth embodiment of this invention. FIG. 20 is a cross-sectional view along the line h—h in FIG. 19. A semiconductor device of the fourth embodiment has a structure in which a chip 180 including protecting elements 200 same as the first embodiment is disposed on an LSI chip 170 of logic circuit by chip-on-chip integration method.

FIG. 19 is a perspective view. As shown in FIG. 19, the semiconductor device has a structure in which logic circuit elements and protecting elements are integrated as separate chips and the chips are laminated and mounted on a frame and the like.

To be more specific, as shown in FIG. 19, a lower chip 170 is a chip in which logic circuits are integrated, and an upper chip 180 is a chip in which the protecting elements 200 are integrated. The lower chip 170 is fixed onto an island 190, and the upper chip 180 is disposed on the lower chip 170. The logic circuit is the same CMOS logic circuit as that of FIG. 17. In a periphery of the chip 170, a GND wiring 112 and ground terminal pads GN are formed, both of which are connected to ground terminals. Moreover, inside the GND wiring 112, power supply terminal pads V and input/output terminal pads IO are disposed. The respective pads or the GND wiring 112 are connected to the logic circuit. Note that, although not shown in FIG. 19, a power supply wiring is also disposed in an overlap portion of the upper chip 180.

On each of the chips 170 and 180, a passivation film such as a silicon nitride film, a silicon oxide film and a polyimide insulating film is formed so as to cover the pads provided in the peripheral portion. Moreover, each of the pads has an opening in its upper portion for bonding connection.

The input/output terminal pads IO, the ground terminal pads GN and the power supply terminal pads V are connected to corresponding leads 191, which are disposed near the pads, respectively, by use of bonding wires 192 and the like.

As shown in FIG. 20, in the protecting element 200, a trench 201T is provided in an undoped substrate 163 of the upper chip 180, and a first n+ region 201 is disposed. A metal layer 201M is an electrode pad connected to the input/output terminal IO. A metal layer forming the electrode pad 201M is buried in the trench 201T and comes into contact with the first n+ region 201.

On the entire surface of the bottom of the upper chip 180, a second n+ region 202 is disposed and comes into contact with a metal layer 202M on its rear surface. Moreover, in the periphery of the upper chip 180, GND pads 201P and a GND wiring 201W are provided, which are connected to the GND terminals. At least a part of the GND pads 201P or the GND wiring 201W comes into contact with the metal layer 202M on the rear surface. As described above, by connecting the GND pad 201P or the GND wiring 201W to the metal layer 202M to which the GND potential is applied, reduction in a resistance of the GND wiring 201W is achieved. Note that, in this case, around a trench 250 which short-circuits the GND pad 201P or the GND wiring 201W, a high-concentration impurity region 251 is also disposed.

Furthermore, as in the case of the logic circuit element in the lower chip 170, the electrode pads 201M of the protecting elements 200 and the GND pads 201P are also connected to the leads 191 disposed near the pads, respectively, by use of the bonding wires 192 and the like. Thus, the ground terminal pads GN and the input/output terminal pads IO on the lower chip 170 are electrically connected to the electrode pads 201P and 201M which are connected to corresponding terminals of the protecting elements.

Specifically, the electrode pads 201M are connected to the input/output terminal pads IO and connected to the leads 191 to which input/output signals is applied. Furthermore, the GND pads 201P are connected to the GND terminal, and the GND potential is applied thereto. Thus, static electricity entering the logic circuit element on the lower chip 170 can be prevented.

In a chip laminated packaging structure, the upper chip 180 can be set to be a chip designed for only the protecting elements 200. Thus, there is no need to consider substrate specifications and processes required for the logic circuit. Therefore, the insulating region 203 required for the protecting element 200 can be easily obtained. Since the chip-on-chip method is used, the pads of the protecting elements 200 and the corresponding pads of the element to be protected can be disposed close to each other. Thus, an efficient layout is possible. Moreover, since the chip area and the chip mounting area can be reduced, an overall size can be reduced.

As described in detail above, the following effects can be achieved according to the embodiment of the present invention.

First, one of terminals of a protecting element is a first n+ region provided to have a columnar shape in a depth direction of a substrate, and the other terminal thereof is a second n+ region provided in a bottom of the substrate. By applying a GND potential to the second n+ region, a first current path and a second current path are formed in an insulating region provided around those regions described above. Accordingly, static current can be discharged to a ground potential. The first n+ region is formed to have the columnar shape, and the second n+ region is formed to have a plate shape perpendicular to the first n+ region. Thus, the amount of a current that flows in the second current path is twice or larger than twice the amount that flows in the first current path, and a significant protecting effect can be achieved. Moreover, a first side of the first n+ region is small, and an area facing the second n+ region is small. Therefore, a parasitic capacity in this portion is very small, and no high-frequency signal leaks. Moreover, since a total parasitic capacity including a parasitic capacity between a second side and the second n+ region is small, no high-frequency signal leaks. Specifically, on the second side, a distance from the second n+ region is gradually increased. Therefore, even in the case where the protecting elements are used in a switch circuit device in which devices having a very small off capacity, such as HEMTs, are used as basic devices, deterioration of an insertion loss due to connection of the protecting elements can be prevented.

Furthermore, the first n+ region is provided along a periphery of a trench, and a conductive material is buried in the trench and connected to a terminal of an element to be protected. Thus, static electricity flows evenly over the entire first n+region, and a protection effect can be increased.

Second, the protecting elements are connected, respectively, to a plurality of terminals in the switch circuit device, to which static electricity may be applied. Thus, it is possible to protect a junction weak in the static electricity, to which the static electricity is directly or indirectly applied.

Third, the protecting elements are connected, respectively, to two terminals of a Schottky junction or a pn junction in the switch circuit device. Thus, the junction weak in electrostatic breakdown can be protected from static electricity.

Fourth, the first n+ region of the protecting element is provided to have a columnar shape in the depth direction of the substrate below a pad or a metal layer connected to the pad, and the second n+ region is provided to have a plate shape in the bottom of the substrate. Thus, an increase in an occupied area by connecting the protecting elements can be suppressed. In a conventional n+/i/n+ type protecting element, an area occupied by the protecting elements within a chip is required by increasing distances of the n+ regions facing each other, in order to enhance the protection effect. However, according to this embodiment, there is an advantage that a space for connecting the protecting elements is hardly required.

Fifth, by connecting the protecting elements of this embodiment in place of a conventional CMOS buffer circuit protecting circuit in an LSI such as a CMOS logic circuit, an area occupied by the protecting elements in the logic circuit can be significantly reduced. Thus, chip shrink of the LSI and cost reduction can be realized.

For example, in the case where a logic circuit element region and a protecting element region are integrated in one chip, the protecting elements can be connected by utilizing input/output terminal pads disposed in a periphery of the logic circuit element region. Thus, the protecting elements can be connected by use of the same chip size as that of a chip consisting of only the logic circuit.

Moreover, a chip integrating protecting elements only can be laminated and mounted on the logic circuit chip. Thus, the protecting elements can be connected without changing an existing pattern of the logic circuit-element. Moreover, the protecting effect can be increased.

What is claimed is:

1. A protecting element protecting an element of a semiconductor device, comprising:
   a semiconductor substrate comprising a top primary plane and a bottom primary plane;
   a first high-concentration impurity region formed in the semiconductor substrate and extending from the top primary plane toward the bottom primary plane;
   a second high-concentration impurity region formed in the semiconductor substrate along the bottom primary plane, a bottom of the first high-concentration impurity region being adjacent the second high-concentration impurity region but not being in contact with the second high-concentration impurity region; and
   an insulating region in contact with the first and second high-concentration impurity regions,
   wherein the first high-concentration impurity region is connected with a terminal of the protected element and a reference potential is applied to the second high-concentration impurity region, and
   the protecting element is configured to release electrostatic energy applied to the terminal of the protected element by inducing a conductive path in the insulating region between the first and second high-concentration impurity regions upon the application of the electrostatic energy.

2. The protecting element of claim 1, wherein the first high-concentration impurity region has a column-like structure extending from the top primary plane toward the bottom primary plane and the induced conductive path comprises a first path induced between the bottom of the first high-concentration impurity region and the second high-concentration impurity region and a second path induced between a sidewall of the column-like structure and the second high-concentration impurity region.

3. The protecting element of claim 1, further comprising a conducting trench structure formed in the semiconductor substrate, wherein the first high-concentration impurity region surrounds the trench structure.

4. The protecting elements of claim 1, further comprising an additional first high-concentration impurity region that is constructed in a same manner as the first high-concentration impurity region and is connected with an additional terminal of the protected element.

5. The protecting element according to claim 3, wherein a conductive material is buried in the trench structure.

6. The protecting element of claim 2, wherein an area of the second high-concentration impurity region is at least fifty times as large as an area of the bottom of the column-like structure.

7. The protecting element of claim 2, wherein a volume of current flowing through the second path is at least twice as large as a volume of current flowing through the first path.

8. The protecting element of claim 2, wherein an edge of the second path is at least 10 µm away from the side wall of the column-like structure.

9. A semiconductor device comprising:
   a semiconductor substrate comprising a top primary plane and a bottom primary plane;
   a field effect transistor formed on the top primary plane and comprising a source electrode, a gate electrode and a drain electrode;
   an input terminal connected with the source electrode or the drain electrode;
   an output terminal connected with the source electrode or the drain electrode that is not connected to the input terminal;
   a control terminal connected with the gate electrode;
   a protecting element, protecting the transistor, comprising a first high-concentration impurity region formed in the semiconductor substrate and having a column-like structure extending from the top primary plane toward the bottom primary plane, a second high-concentration impurity region formed in the semiconductor substrate along the bottom primary plane, a bottom of the first high-concentration impurity region being adjacent the second high-concentration impurity region but not being in contact with the second high-concentration impurity region, and an insulating region in contact with the first and second high-concentration impurity regions,
   wherein the first high-concentration impurity region is connected with one of the terminals of the transistor and a reference potential is applied to the second high-concentration impurity region, and
   the protecting element is configured to release electrostatic energy applied to the terminal connected with the first high-concentration impurity region by inducing a first conductive path between the bottom of the first high-concentration impurity region and the second high-concentration impurity region and a second conductive path between a sidewall of the column-like structure and the second high-concentration impurity region.

10. The semiconductor device of claim 9, further comprising an additional filed effect transistor formed on the top primary plane and comprising a source electrode, a gate electrode and a drain electrode, wherein the input terminal is connected with the source electrode or the drain electrode of the additional transistor to form a common input terminal.

11. The semiconductor device of claim 9, further comprising a conducting trench structure formed in the semiconductor substrate, wherein the first high-concentration impurity region surrounds the trench structure to form the column-like structure.

12. The semiconductor device of claim 9, further comprising an additional first high-concentration impurity region that is constructed in a same manner as the first high-concentration impurity region and is connected with one of the terminals that is not connected with the first high-concentration impurity region.

13. The semiconductor device of claim 12, wherein the terminals connected with the first high-concentration impurity region or the additional first high-concentration impurity region are the input terminal and the control terminal.

14. The semiconductor device of claim 9, wherein the first high-concentration impurity region is in contact with an electrode pad of the connected terminal.

15. The semiconductor device of claim 14, wherein the first high-concentration impurity region is disposed below the electrode pad.

16. The semiconductor device of claim 11, wherein a conductive material is buried in the trench structure.

17. The protecting element of claim 9, wherein an area of the second high-concentration impurity region is at least fifty times as large as an area of the bottom of the column-like structure.

18. The semiconductor device of claim 9, wherein a volume of current flowing through the second conductive path is at least twice as large as a volume of current flowing through the first conductive path.

19. The protecting element of claim 9, wherein an edge of the second path is at least 10 μm away from the side wall of the column-like structure.

20. A semiconductor device comprising:
a semiconductor substrate comprising a top primary plane and a bottom primary plane;
an integrated circuit element comprising an input-and-output terminal, a power supply terminal and a ground terminal;
a protecting element, protecting the integrated circuit element, comprising a first high-concentration impurity region formed in the semiconductor substrate and having a column-like structure extending from the top primary plane toward the bottom primary plane, a second high-concentration impurity region formed in the semiconductor substrate along the bottom primary plane, a bottom of the first high-concentration impurity region being adjacent the second high-concentration impurity region but not being in contact with the second high-concentration impurity region, and an insulating region in contact with the first and second high-concentration impurity regions,
wherein the first high-concentration impurity region is connected with the input-and-output terminal and the second high-concentration impurity region is connected with the ground terminal, and
the protecting element is configured to release electrostatic energy applied to the input-and-output terminal by inducing a first conductive path between the bottom of the first high-concentration impurity region and the second high-concentration impurity region and a second conductive path between a sidewall of the column-like structure and the second high-concentration impurity region.

21. The semiconductor device of claim 20, further comprising a conducting trench structure formed in the semiconductor substrate, wherein the first high-concentration impurity region surrounds the trench structure to form the column-like structure.

22. The semiconductor device of claim 20, wherein the integrated circuit element comprises a CMOS logic circuit element.

23. The semiconductor device of claim 20, wherein the integrated circuit element is formed on the top primary plane.

24. The semiconductor device of claim 20, wherein the integrated circuit element and the protecting element are formed in different semiconductor substrates.

25. The semiconductor device of claim 20, wherein the first high-concentration impurity region is in contact with an electrode pad of the input-and-output terminal.

26. The semiconductor device of claim 25, wherein the first high-concentration impurity region is disposed below the electrode pad.

27. The semiconductor device of claim 21, wherein a conductive material is buried in the trench structure.

28. The protecting element of claim 20, wherein an area of the second high-concentration impurity region is at least fifty times as large as an area of the bottom of the column-like structure.

29. The semiconductor device of claim 20, wherein a volume of current flowing through the second path is at least twice as large as a volume of current flowing through the first path.

30. The protecting element of claim 20, wherein an edge of the second path is at least 10 μm away from the side wall of the column-like structure.

* * * * *